United States Patent [19]

Hori et al.

[11] Patent Number: 4,831,432

[45] Date of Patent: May 16, 1989

[54] POSITIVE CERAMIC SEMICONDUCTOR DEVICE

[75] Inventors: Makoto Hori, Ogaki; Itsuhei Ogata, Kariya; Hitoshi Niwa, Okazaki; Naoto Miwa, Tsushima, all of Japan

[73] Assignee: Nippondenso Co., Ltd., Kariya, Japan

[21] Appl. No.: 19,972

[22] Filed: Feb. 27, 1987

[30] Foreign Application Priority Data

| | | | |
|---|---|---|---|
| Feb. 27, 1986 | [JP] | Japan | 61-42698 |
| Mar. 25, 1986 | [JP] | Japan | 61-66922 |
| Mar. 31, 1986 | [JP] | Japan | 61-74930 |
| Apr. 4, 1986 | [JP] | Japan | 61-78849 |

[51] Int. Cl.[4] ...................... H01L 23/54; H01L 23/48

[52] U.S. Cl. ...................................... 357/67; 338/309; 357/65

[58] Field of Search ....................... 357/67, 71, 51, 65; 338/22 SD, 22 R, 309, 327, 328, 308; 219/505; 420/463, 505

[56] References Cited

U.S. PATENT DOCUMENTS

| | | | |
|---|---|---|---|
| 3,588,636 | 6/1971 | Giesfeldt | 357/67 |
| 3,987,217 | 10/1976 | Greeson et al. | 357/67 |
| 4,316,171 | 2/1982 | Miyabayashi et al. | 338/309 |
| 4,380,528 | 4/1983 | Shevakin et al. | 420/505 |
| 4,411,863 | 10/1983 | Otsuka et al. | 420/505 |
| 4,458,294 | 7/1984 | Womack | 338/309 |
| 4,579,787 | 4/1986 | Heidsiek et al. | 420/463 |
| 4,663,189 | 5/1987 | Borland | 420/463 |

FOREIGN PATENT DOCUMENTS

| | | | |
|---|---|---|---|
| 47-27713 | 7/1972 | Japan . | |
| 0010567 | 1/1977 | Japan | 338/308 |
| 58-7044 | 2/1983 | Japan . | |
| 59-17510 | 4/1984 | Japan . | |
| 770175 | 3/1957 | United Kingdom | 338/327 |

*Primary Examiner*—Andrew J. James
*Assistant Examiner*—S. V. Clark
*Attorney, Agent, or Firm*—Cushman, Darby & Cushman

[57] ABSTRACT

A positive ceramic semiconductor device having positive temperature coefficient of resistance comprises a pair of electrodes provided on a ceramic semiconductor substrate. One of the paired electrodes which is to serve as the positive pole is basically constituted by at least an electrically conductive layer of silver-palladium series containing silver and palladium at a predetermined ratio. For preventing a localized current concentration from occurring in the current conducting state, improvement is made as the structure of the positive pole electrode formed of the electrically conductive material of silver-palladium series and/or the structure of the negative pole electrode. Silver-migration phenomenon on the positive ceramic semiconductor substrate as well as degradation of the mechanical strength thereof is positively prevented.

21 Claims, 11 Drawing Sheets

POSITIVE CERAMIC SEMICONDUCTOR DEVICE

BACKGROUND OF THE INVENTION

1. FIELD OF THE INVENTION

The present invention relates to a ceramic semiconductor device exhibiting a positive temperature coefficient of resistance (hereinafter referred to as positive ceramic semiconductor device) which can be used as heat generating elements of various types or as current control elements in electric circuits.

2. DESCRIPTION OF THE RELATED ART

The hitherto known positive ceramic semiconductor device is typically of such a structure which has a pair of electrodes each of a two-layer structure composed of a nickel layer and a silver layer implemented by forming first the nickel layer on each of upper and lower surfaces of a positive ceramic semiconductor substrate, and then forming the silver layer over the surface of the nickel layer (reference may be made to Nos. JP-B-58-7044 and JP-A-47-2713).

In the hitherto known positive ceramic semiconductor device of the structure mentioned above, there takes place so-called silver-migration phenomenon in which silver constituents in the silver layer migrate along the surface of the substrate from the electrode serving as positive pole toward the electrode serving as negative pole when a predetermined potential difference is applied across the paired electrodes of positive and negative poles, respectively. The migration of silver is significantly accelerated in the atmosphere of high temperature and high humidity or moisture. This phenomenon is often accompanied with formation of short-circuit between the electrodes, degrading thus performance of the positive ceramic semiconductor device.

Further, it is observed in the positive ceramic semiconductor device that when a current flows through the semiconductor substrate, the current flow is locally concentrated, giving rise to a localized heat generation. As the result, a crack is produced in the ceramic semiconductor substrate due to thermal stress, possibly incurring unwanted degradation in the mechanical strength of the substrate.

Under the circumstances, there exists a demand for improving the positive ceramic semiconductor device so as to exhibit stable characteristics by suppressing as perfectly as possible the silver-migration phenomenon and at the same time preventing the thermal destruction of the semiconductor substrate due to the localized heat generation.

The present invention has been made with a view to satisfying the demand mentioned above.

SUMMARY OF THE INVENTION

A first object of the present invention is to provide a positive ceramic semiconductor device in which occurrence of the silver-migration phenomenon on the positive ceramic semiconductor substrate described above is suppressed in a satisfactory manner.

With a view to achieving the abovementioned object, there is provided according to an aspect of the present invention a positive ceramic semiconductor device comprising a pair of electrodes formed on a positive ceramic semiconductor substrate, in which one of the paired electrodes destined to serve as the positive pole is formed of an electrically conductive alloy material containing silver and palladium of such a composition in which the content of silver ranges from 40 wt. % (percent by weight) to 90 wt. % while that of palladium ranges from 60 to 10 wt. %. In consideration of occurrence of the silver-migration phenomenon more or less, current concentration due to interfacial resistance making appearance on the positive ceramic semiconductor substrate and the cost of palladium, it is preferred that the content of palladium in the silver-palladium series should be in a range of 10 wt. % to 60 wt. %. Further, in view of the reliability of performance and cost of the positive ceramic semiconductor device, the content of palladium should more preferably be selected to be in a range of 20 wt. % to 30 wt. %.

A second object of the present invention is to provide a positive ceramic semiconductor device which has the basic structure proposed above and in which localized heat generation due to the current concentration in the electrically conducting state is prevented to thereby protect the ceramic semiconductor substrate against degradation in the mechanical strength.

For accomplishing the second object mentioned above, there is provided according to another aspect of the invention a positive ceramic semiconductor device which has a pair of electrodes formed on a positive ceramic semiconductor substrate and in which one of the paired electrodes serving as the positive pole is formed of at least an electrically conductive layer constituted by silver particles having respective surfaces deposited with solid solution layers of silver-palladium, wherein the content of silver ranges from 80 wt. % to 98 wt. % with that of palldium ranging from 20 wt. % to 2 wt. % in the silver-palledium series.

In view of the second mentioned object, there is further provided according to still another aspect of the invention a positive ceramic semiconductor device which includes a pair of electrodes provided on a positive ceramic semiconductor substrate and in which one of the paired electrodes to serve as the positive pole is constituted by an electrically conductive metal layer ohmic-contacted to the substrate and an electrically conductive layer formed on the electrically conductive metal layer and including an alloy of silver and palladium, the electrically conductive metal layer ohmic-contacted to the substrate containing a metal material having a high electric conductivity as compared with that of the electrically conductive layer containing the silver-palladium alloy, wherein composition of the two-constituent series of silver and palladium is so selected that the content of silver ranges from 40 wt. % to 90 wt. % while that of palladium ranges from 60 wt. % to 10 wt. %.

Additionally, for accomplishing the second mentioned object, there is provided according to a further aspect of the invention a positive ceramic semiconductor device which includes a pair of electrodes provided on a positive ceramic semiconductor substrate and in which one of the paired electrodes to serve as the electrode of positive pole is constituted by a single electrically conductive layer containing an alloy of silver and palladium, wherein the composition of the two-component series of silver and palladium is so selected that the content of silver lies within a range of 40 wt. % to 90 wt. % while that of palladium is in a range of 60 wt. % to 10 wt. %. On the other hand, the other electrode to function as the negative pole is constituted by an electrically conductive metal layer ohmic-contacted to the ceramic semiconductor substrate and an electrically conductive layer formed on the metal layer and containing an alloy of silver and palladium, the ohmic-contacted electrically conductive metal layer containing a metal material having a high electric conductivity when compared with that of the layer containing the alloy of silver and palladium, wherein the composition of the two-component series of silver and palladium is so selected that the content of silver is in a range of 40 wt. % to 90 wt. % while that of palladium is in a range of 60 wt. % to 10 wt. %.

Furthermore, for achieving the second mentioned object, there is provided according to a still further aspect of the invention a positive ceramic semiconductor device which has a pair of electrodes provided on the surfaces of a positive ceramic semiconductor substrate and in which one of the paired electrodes to serve as the positive pole is formed of at least an electrically conductive material containing at least silver and palladium at such a ratio that the content of silver in the silver-palladium series ranges from 40 wt. % to 90 wt. % with that of palladium ranging from 60 wt. % to 10 wt. %, while the other of the paired electrodes to serve as the negative pole is realized in a two-layer structure constituted by a first electrically conductive layer formed on a surface of the ceramic substrate in ohmic-contact therewith and a second electrically conductive layer formed on the first electrically conductive layer and the surface of the ceramic semiconductor substrate in such a manner as to cover an outer peripheral edge of the first electrically conductive layer, wherein the second electrically conductive layer is formed of an electrically conductive material which contains 40 wt. % to 90 wt. % of silver, 60 wt. % to 10 wt. % of palladium and at least one base metal selected from a group consisting of tin, indium, gallium, alloys of indium and gallium, nickel, antimony and aluminum. The ceramic substrate is preferably formed of a barium titanate series material.

DESCRIPTION OF THE PREFERRED EMBODIMENTS

Figure 1:
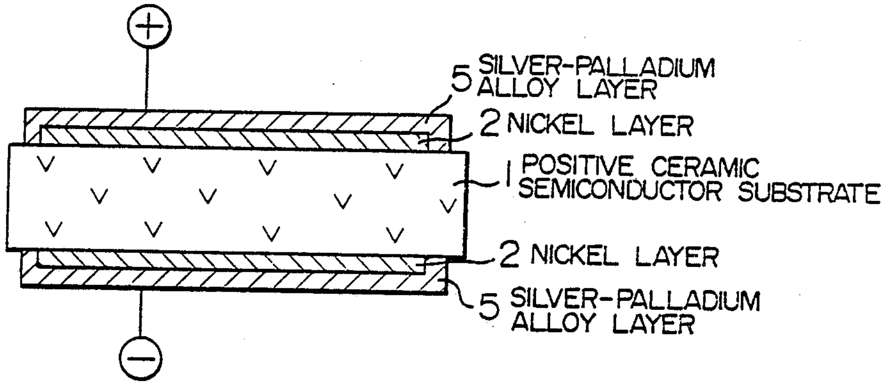
FIG. 1, FIG. 2, FIG. 3, FIG. 4 and FIG. 5 are vertical sectional views showing, respectively, electrode structures of positive ceramic semiconductor devices according to basic embodiments of the present invention.

FIGS. 1 to 5 show, in vertical sections, positive ceramic semiconductor devices implemented according to basic embodiments of the present invention. Referring to FIG. 1, the positive ceramic semiconductor device includes nickel layers 2 which are formed, respectively, on both surfaces of a positive ceramic semiconductor substrate 1 in ohmic contact therewith, and electrically conductive layers 5 constituted by silver-palladium alloy layers, respectively, and formed on the nickel layers 2 in such a manner as to cover the outer peripheral edge as well as the surfaces thereof. The substrate 1 is constituted by a material of barium titanate series which exhibits a positive temperature coefficient of resistance and has a Curie point at which resistance of the material increases steeply at a predetermined temperature.

In the case of the abovementioned positive ceramic semiconductor device shown in FIG. 1, the electrode destined to serve as the electrode of the positive pole is realized in a two-layer structure of the nickel layer 2 and the silver-palladium alloy layer 5. In contrast thereto, a positive ceramic semiconductor device shown in FIG. 2 has the positive pole electrode which is constituted only by a single silver-palladium alloy layer 5. It will however be noted that the negative pole electrode is of the same structure as the one shown in FIG. 1.

Figure 3:
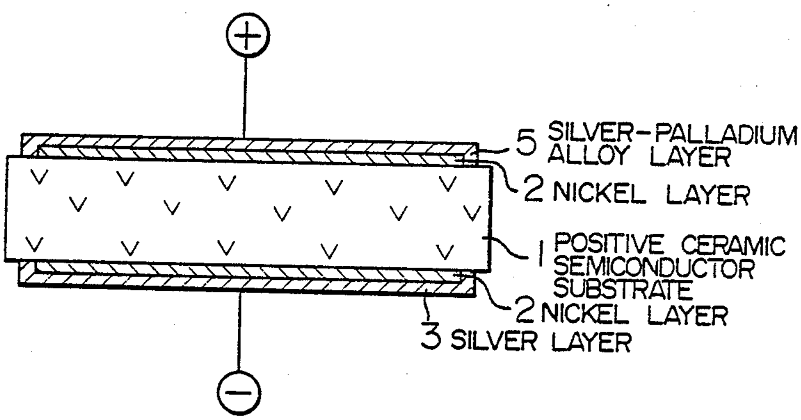

In the case of a positive ceramic semiconductor device shown in FIG. 3, the positive pole electrode is of the same structure as the one shown in FIG. 1. On the other hand, the negative pole electrode is realized in a two-layer structure constituted by a nickel layer 2 and a silver layer 3 similarly to that of the hitherto known positive ceramic semiconductor device.

Figure 2:
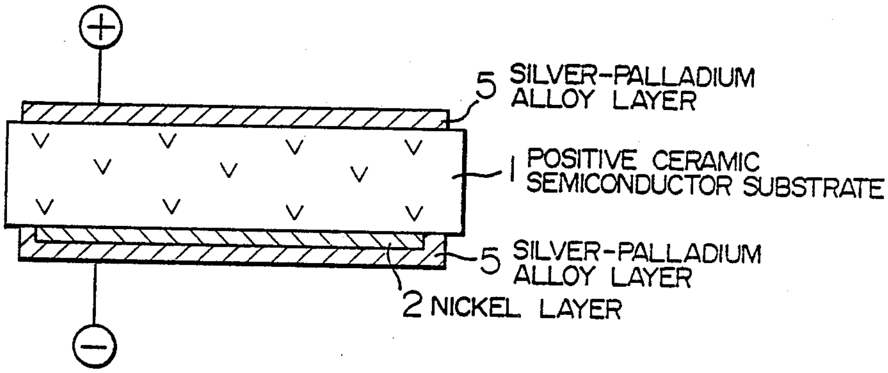
Figure 4:
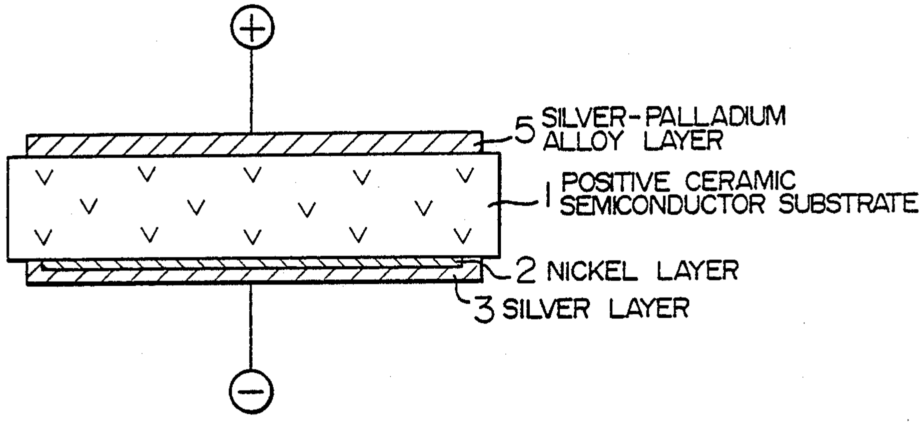

In a positive ceramic semiconductor device shown in FIG. 4, the positive pole electrode is of the same structure as the one shown in FIG. 2 while the negative pole electrode is realized similarly to that of the hitherto known device as in the case of the embodiment shown in FIG. 3.

Figure 5:
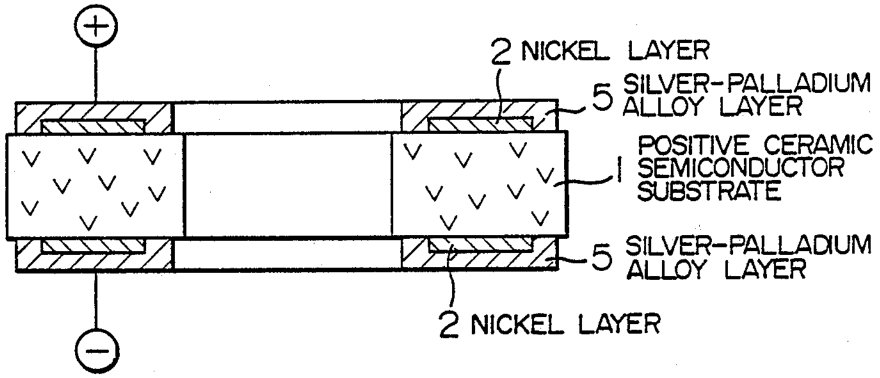

The positive ceramic semiconductor device shown in FIG. 5 differs from those shown in FIGS. 1 to 4 in that the positive ceramic semiconductor substrate is realized in a ring-like configuration rather than the disk-like configuration adopted in the devices shown in FIGS. 1 to 4. The electrode structure of the embodiment shown in FIG. 5 is identical with that of the device shown in FIG. 1.

Next, a method of fabricating the positive ceramic semiconductor device according to the invention will be described in conjunction with the embodiment shown in FIG. 5, by way of example.

Both surfaces of a ring-like positive ceramic semiconductor substrate (fired product) 1 of a material belonging to barium titanate series and manufactured by a conventional method are ground by an abrasive particulate material, e.g. abrasive particles of silicon carbide. After cleansing, the ground substrate is dried.

Subsequently, an activated paste containing palladium chloride which may be the one available under the trade name "K146" from Japan Kanizen Co. Ltd. is screen-printed over both surfaces of the substrate. After drying, the paste is fired or baked at a temperature of 400° C. to 700° C.

After the baking process, the substrate is immersed in a nonelectrolyte plating bath of Ni-P series to be plated with nickel. Thereafter, firing is performed at a temperature of 200° C. to 450° C., to thereby form nickel layers on both surfaces of the substrate, respectively.

Subsequently, a paste containing silver particles of size less than 1 μm on an average and palladium particles of 800 Å in size on an average is applied over each of the nickel layers through screen printing, the resultant product being then baked at a temperature of 600° C. for 15 minutes, whereby silver and palladium are all transformed to a solid solution constituting a twoelement alloy.

It will be understood that the positive ceramic semiconductor devices shown in FIGS. 1 to 4 can also be manufactured according to the process described above.

A plurality of specimens of the positive ceramic semiconductor devices manufactured according to the process mentioned above and in which the proportion or ratio of contents of silver and palladium was changed were prepared and examined in respect to the migration proof property and the interfacial resistance. The results of the examination will be described below.

Each of the positive ceramic semiconductor substrates employed in the specimen was implemented in a ring-like configuration shown in FIG. 5 and has an outer diameter of 35.0 mm, an inner diameter of 25.0 mm and a thickness of 2.5 mm. These specimens were subjected to a continuous conduction withstanding test at a room temperature by applying a voltage of 14 V continuously for 2000 hours in an air stream at a flow rate of 20 g/sec.

Figure 6:
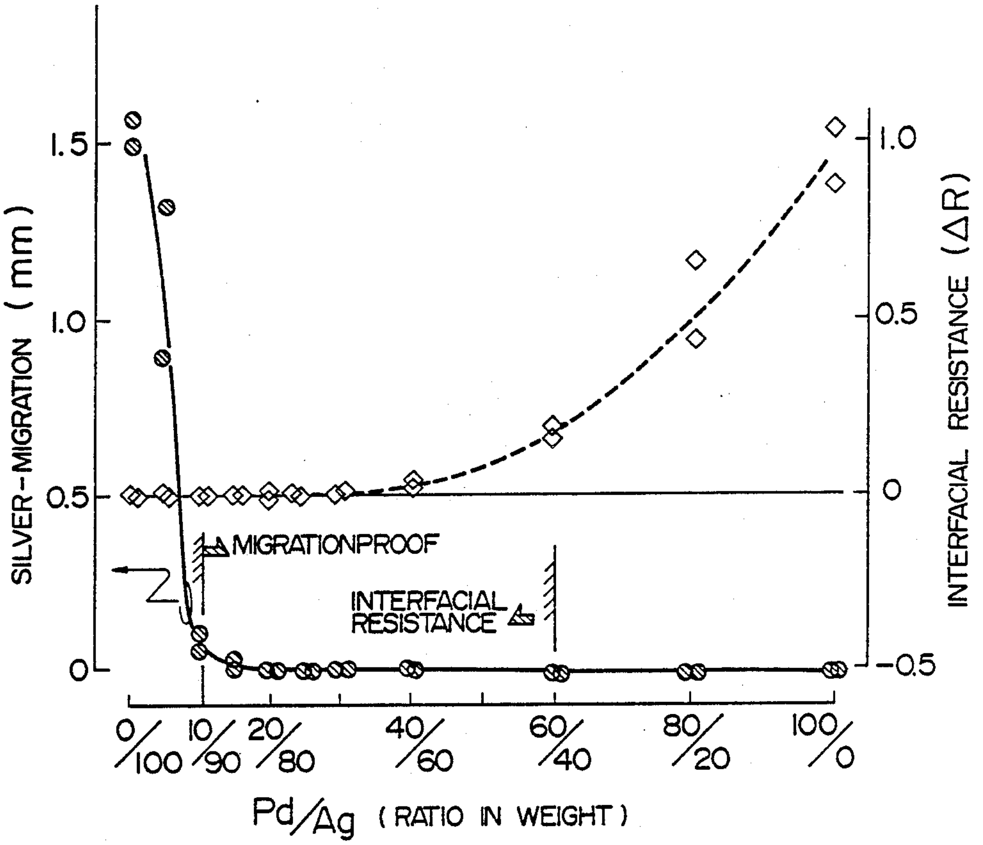
FIG. 6 is a view showing graphically characteristics of the positive ceramic semiconductor devices according to the basic embodiments of the invention for illustrating operative features and effects thereof.

The results of the test are illustrated in FIG. 6 in which distance covered by migration is taken along the left-hand ordinate, while the interfacial resistance (ΔR) is taken along the right-hand ordinate. The interfacial resistance is determined in accordance with the following expression:

$$\Delta R = R_{Ni-Ag/Pd} - R_{Ni})/R_{Ni}$$

where $R_{Ni}$ represents the resistance value of the positive ceramic semiconductor device (of the configuration and dimensions mentioned above) which has, however, both electrodes of positive and negative pole which are made of nicle (formed by baking at 300° C. for two hours), and $R_{Ni-Ag/Pd}$ represents the resistance value of the positive ceramic semiconductor device having positive and negative pole electrodes each realized in the two-layer structure of the nickel layer and the silver-palladium alloy layer as described hereinbefore in conjunction with the manufacturing method. Saying in another way, the interfacial resistance (ΔR) represents in terms of ratio the difference between the resistance value of the nickel electrode employed as the reference value and that of the electrode according to the invention.

It will be seen from FIG. 6 that significant change occurs in the silver-migration phenomenon across a boundary corresponding to the content of palladium of 10 wt. % and that no migration phenomenon takes place in a range in which the content of palladium is not less than 10 wt. %.

The maximum coverage distance of the migration is about 1.5 mm in the hitherto known positive ceramic semiconductor device, which means very poor performance of the device.

On the other hand, the interfacial resistance is increased progressively as the content of palladium increases beyond the ratio of about 40% with the rate of increasing in the interfacial resistance becoming significant when the content of palladium increases beyond 60%.

It should be noted that the interfacial resistance is definitely determined in dependence on the electrode structure. Accordingly, the aforementioned expression holds true for the positive ceramic semiconductor device shown in FIG. 1 since this device differs from the one shown in FIG. 5 only in respect to the geometrical configuration. However, in the case of the positive ceramic semiconductor device shown in FIG. 3 in particular, the resistance value of the electrode as used must be substituted for $R_{Ni-Ag/Pd}$ in the aforementioned expression.

Thus, the characteristic curve of the interfacial resistance of the positive ceramic semiconductor device shown in FIG. 3 differs from the one illustrated in FIG. 6. However, the content ratio of 60 wt. % defining the upper limit of the allowable palladium content range delimited due to the interfacial resistance also applies valid to the device shown in FIG. 3 similarly to the one shown in FIG. 5. In the case of the embodiments shown in FIGS. 2 and 4, respectively, the electrode structure is in non-ohmic contact without incorporating the Ni-layer. Thus, it is impossible to measure the interfacial resistance. Accordingly, the interfacial resistance was determined on the basis of the rush current, from which it has been found that the content ratio of 60 wt. % of palladium defines the upper limit of the allowable content range for palladium also in these embodiments.

The positive ceramic semiconductor devices according to the embodiments of the invention described above are excellent in respect to their corrosion proof property when used in gasoline, in view of the fact that palladium exhibits a high withstanding capability and is durable to sulfur and chlorine. Accordingly, these positive ceramic semiconductor devices can be used in gasoline in the exposed condition without any need for protecting the electrodes.

As will be appreciated from the foregoing description, the positive ceramic semiconductor device according to the invention resides in a structure which includes a pair of electrodes provided on both surfaces of the positive ceramic semiconductor substrate, the one of the paired electrodes to serve as the positive pole electrode is formed of an electrically conductive alloy material containing silver and palladium, wherein composition of the silver-palladium series is so selected that the content of silver lies within a range of 40 wt. % to 90 wt. % while that of palladium is in a range of 60 wt. % to 10 wt. %.

In the illustrated embodiments, the migrationproof property is enhanced as the content of palladium increases, and no migration phenomenon takes place any more when the content of palladium is increased beyond 10 wt. %. If the content of palladium greater than 40 wt. % is employed, the interfacial resistance makes appearance between the positive ceramic semiconductor substrate and the electrode, giving rise to corresponding reduction in the rush current, while the surface resistance is increased to decrease the contact region to a point contact, providing a cause for the current concentration. Besides, increased content of palladium makes the positive ceramic semiconductor device more expensive. Thus, from the practical and economical viewpoint, it is preferred that the content of palladium should not go beyond 60 wt. %.

In brief, the content of palladium in the silver-palladium series should preferably be in a range of 10 wt. % to 60 wt. % and more preferably in a range of 20 wt. % to 30 wt. % when considering the reliability in performance and the cost involved.

As described hereinbefore, the silver-migration phenomenon propagates from the positive pole electrode toward the negative pole electrode. Accordingly, the silver-migration phenomenon can be prevented by using an electrically conductive material of the silver-palladium series according to the invention in forming the positive pole electrode even when the negative pole electrode is of the conventional structure. The positive pole electrode may be realized either in a two-layer structure composed of a nickel layer formed on the surface of a positive ceramic semiconductor substrate and a silver-palladium alloy layer formed on the nickel layer or in a single-layer structure composed of a silver-palladium alloy layer formed on the surface of the positive ceramic semiconductor substrate.

The negative pole electrode may be realized in a two-layer structure composed of a nickel layer and a silver layer formed thereon or in the same two-layer structure as that of the positive pole electrode.

The present invention is not restricted to the illustrative basic embodiments described above but susceptible to various modifications as mentioned below.

(1) Third constituent or component such as various types of frits, bismuth or the like may be added in addition to silver and palladium for enhancing the bonding strength, brazing feasibility and other properties.

(2) As the method of fabricating the electrode containing silver and palladium, there may be adopted a sputtering method, chemical vapor deposition (CVD), vacuum evaporation and others in addition to the paste printing method.

(3) The nickel layer may be replaced by other metal layer capable of forming ohmic contact with the substrate 1 such as, for example, aluminum and bronze.

(4) The geometry of the positive ceramic semiconductor device is neither restricted to the disk-like configuration nor the ring-like configuration but may be of any given shape inclusive of a honeycomb structure having a number of through-holes in the axial direction.

(5) The pair of electrodes may be formed on one surface of the positive ceramic semiconductor substrate with a distance between the electrodes instead of forming the electrodes on both opposite surfaces of the substrate, respectively.

Now, description will be made of a modified embodiment of the present invention. The structure of the basic embodiments described above suffers a problem in that when a current is supplied to the positive ceramic semiconductor device according to the basic embodiment of the invention, the current flow tends to concentrate at a location to bring about a local heat generation, as a result of which the ceramic semiconductor substrate might be cracked to decrease the mechanical strength. With the modified embodiment, it is intended to eliminate such shortcoming.

Figure 7:
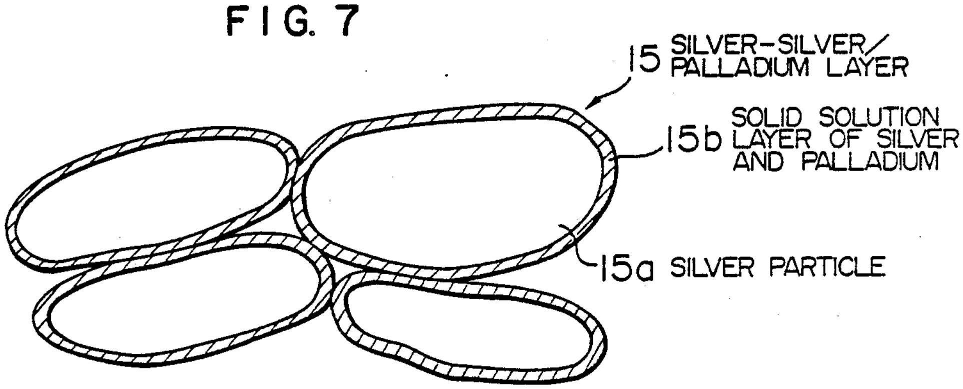
FIG. 7 is a view showing schematically a structure of an electrode of a positive ceramic semiconductor device according to a modified embodiment of the present invention.
Figure 8:
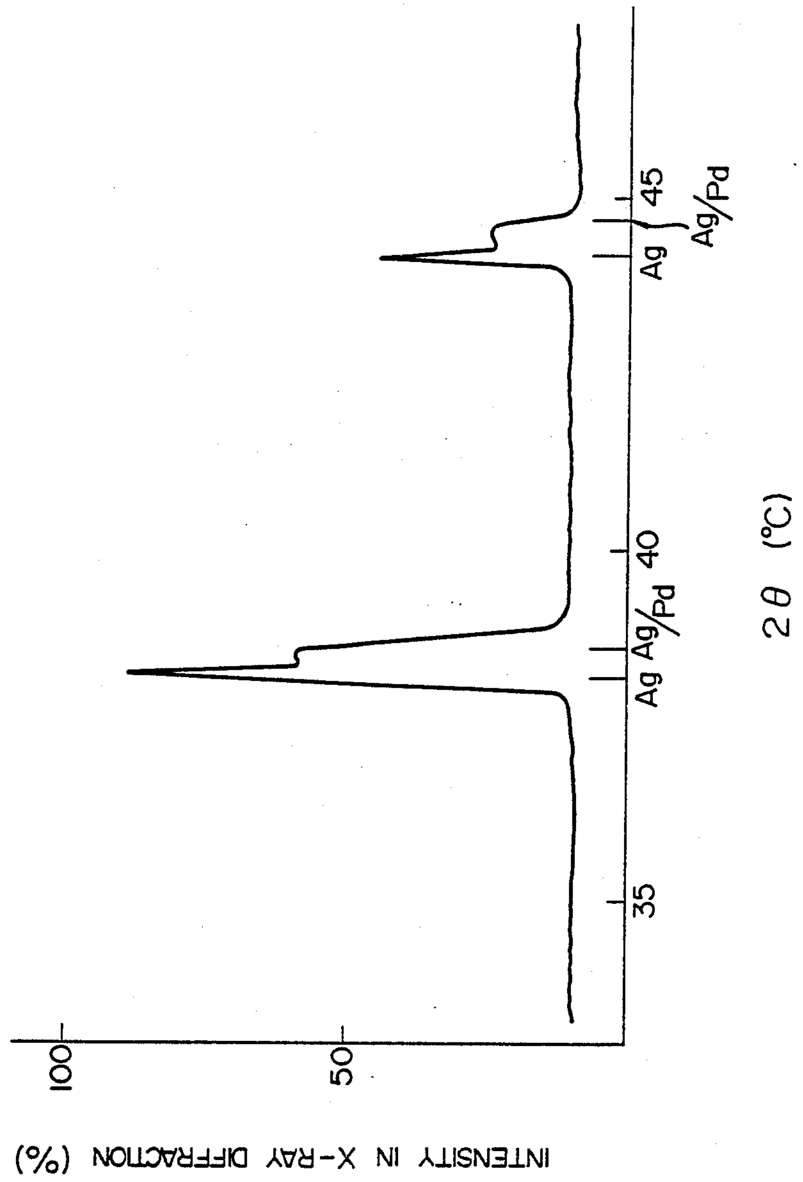
FIG. 8 and FIG. 9 are views showing characteristics of the modified embodiment of the invention for illustrating operative features and effects thereof.

A structure characterizing the modified embodiment of the invention is shown in FIG. 7. More sepcifically, this figure shows a structure of the aforementioned electrically conductive layer constituting the electrode according to the invention on an enlarged or microscopical scale. According to the teaching incarnated in the modified embodiment, an electrically conductive layer 15 is formed of silver particles 15*a* each having a surface coated with a solid solution layer of silver and palladium 15*b*. This electrically conductive layer 15 is used in place of the electrically conductive layer 5. Hereinafter, this layer 15 will be referred to as the silver-silver/palladium layer 15.

With respect to other structural features, the positive ceramic semiconductor device according to the modified embodiment is utterly same as those of the basic embodiments shown in FIGS. 1 to 5. Besides, the method of manufacturing the positive ceramic semiconductor device according to the modified embodiment under consideration is substantially same as the method of the basic embodiments described hereinbefore except that a prepared paste containing silver and palladium is screen-printed on the nickel layers formed on both surfaces of the ceramic semiconductor substrate and baked at a temperature of 600° C. for 15 minutes. According to a method of preparing the aforementioned paste, silver powder having particle size of 2 μm to 3 μm on an average and palladium powder having particle size of 800 Å on an average are mixed at a ratio of 90 wt. % of silver and 10 wt. % of palladium to form a silver-palladium powder mixture. The resultant powder is dispersed homogeneously in an organic binder (e.g. ethyl cellulose) to prepare the paste.

The silver-silver/palladium layer 15 obtained after baking the paste was analyzed through X-ray diffraction. It has been observed that peaks of intensity occur at silver and silver/palladium solid solution (forming an alloy). Thus, it is determined that the surface of each silver particle is formed with a layer of silver/palladium solid solution.

Although the past preparing method has been described in conjunction with the positive ceramic semiconductor device shown in FIG. 5, the devices shown in FIGS. 1 to 4 can be fabricated according to the manufacturing method described just above.

A plurality of specimens of the positive ceramic semiconductor devices manufactured through the process mentioned above in which the proportion of contents of silver and palladium was changed were prepared and examined in respect to the migrationproof property and the surface resistance. The results of the examination will be described below.

Each of the specimens was implemented in a ring-like configuration shown in FIG. 5 and had an outer diameter of 35.0 mm, an inner diameter of 25.0 mm and a thickness of 2.5 mm. These specimens were subjected to a continuous conduction withstanding test at a room temperature by applying voltage of 14 V continuously for 2000 hours in an air stream at a flow rate of 20 g/sec. The substrate of each specimen had a resistance of 1.5 Ωat 20° C.

Figure 9:
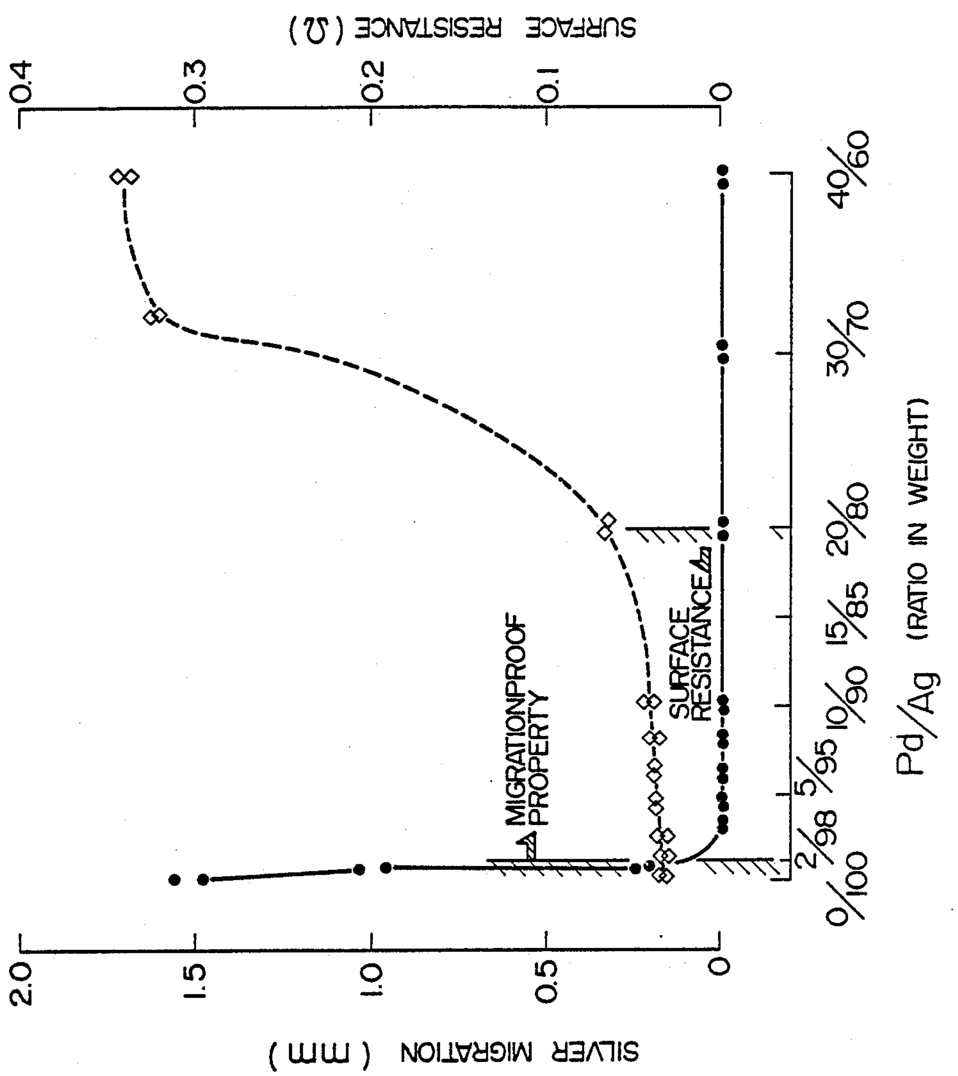

The results of the test are illustrated in FIG. 9, in which distance covered by the migration is taken along the left-hand ordinate, while the surface resistance is taken along the right-hand ordinate. The surface resistance (Ω) was measured by contacting probes to the electrode surface at two discrete points.

Referring to FIG. 9, it will be seen that the migration-proof property undergoes significant change across a boundary corresponding to the palladium content of 2 wt. % in the silver-palladium series. When the content of palladium increases beyond this boundary, no migration phenomenon takes place at all. In contrast, the surface resistance of the electrode itself is progressively increased. When the content of palladium exceeds 20 wt. %, change in the surface resistance becomes more significant. On the other hand, so long as the content of palladium is within a range of 5 wt. % to 10 wt. %, no migration phenomenon takes place at all with the surface resistant being substantially zero, indicating excellent performance of the positive ceramic semiconductor device.

As will be appreciated from the above description, the positive ceramic semiconductor device according to the embodiment described just above includes a pair of electrode provided on a positive ceramic semiconductor substrate, one of the paired electrodes which is to serve as the electrode of positive pole being constituted by at least an electrically conductive layer containing silver particles having respective surfaces formed with silver-palladium solid-solution layers, wherein content of silver in the silver and palladium series is so selected as to lie within a range of 80 wt. % to 98 wt. % while that of palladium is in a range of 20 wt. % to 2 wt. %.

According to this embodiment, the electrode to serve as the positive pole is composed of the electrically conductive layer constituted by silver particles having surfaces formed with solid-solution layers containing silver and palladium. In this connection, it should however be noted that the composition of silver and palladium as a whole exerts significant influence to the characteristics of the positive ceramic semiconductor device.

More specifically, no migration phenomenon takes place when the content of palladium exceeds 2 wt. %. However, when the content of palladium exceeds 15 wt. %, the surface resistance of the electrode itself becomes progressively increased. Beyond 20 wt. % of palladium content, the increasing rate of the surface resistance becomes significant, involving significant tendency of the current concentration.

Accordingly, the content of palladium should preferably be so selected as to be in a range of 2 wt. % in consideration of the migrationproof property and the surface resistance. Further, from the standpoint of reliability in performance and cost, the content of palladium should more preferably lie within a range of 5 wt. % to 15 wt. %.

It should further be added that in the electrically conductive layer constituting the positive pole electrode according to the instant embodiment, the solid solution layer containing silver and palladium need not be formed on the surfaces of all the silver particles. For example, integral solid solution particles of silver and palladium may be present in a sparsely dispersed state.

Also in case of the positive ceramic semiconductor device according to the instant embodiment, the silver-migration phenomenon takes place in the direction toward the negative pole from the positive pole. Accordingly, the silver-migration phenomenon can be prevented from occurrence by realizing only the positive pole electrode in the inventive structure described above even when the negative pole electrode is of a conventional structure. Further, the positive pole electrode may be implemented in the two-layer structure composed of the nickel layer formed on the surface of the positive ceramic semiconductor substrate and the material layer of the composition according to the invention described above, respectively.

The instant embodiment is susceptible to various version as in the case of those described hereinbefore and can assure advantageous effects similar to those attained by the basic embodiment. In a version of the instant embodiment, a modification mentioned below may be effectuated.

(6) It is possible to prepare the paste containing silver and palladium by mixing a prepared silver paste and a prepared palladium paste in advance.

Additionally, another advantageous effect may be seen in that when compared with the electrode formed totally of the silver-palladium solid solution the surface resistance of the positive pole electrode can be made significantly low due to the presence of silver because the silver-palladium solid solution layer is formed only on the surface of the silver particle. Consequently, upon current flow through the aforementioned electrically conductive layer, the current can flow through the whole electrode due to the presence of silver, whereby such undesirable phenomenon can be positively avoided that current concentration on a localized conducting point which would occur in the case of the electrically conductive layer formed totally of the integral silver-palladium solid solution and presenting great surface resistance takes place to produce crack in the semiconductor substrate due to localized heat generation, thus enfeebling the mechanical strength of the substrate.

The following description is directed to further modified embodiments of the present invention which also tackle the problem of the mechanical strength of the substrate being enfeebled in the case of the positive ceramic semiconductor devices implemented according to the basic embodiment.

Now, the preferred working modes of the further modified embodiments will be described by referring to FIGS. 10 to 14 in which like components are designated by like reference symbols.

Figure 10:
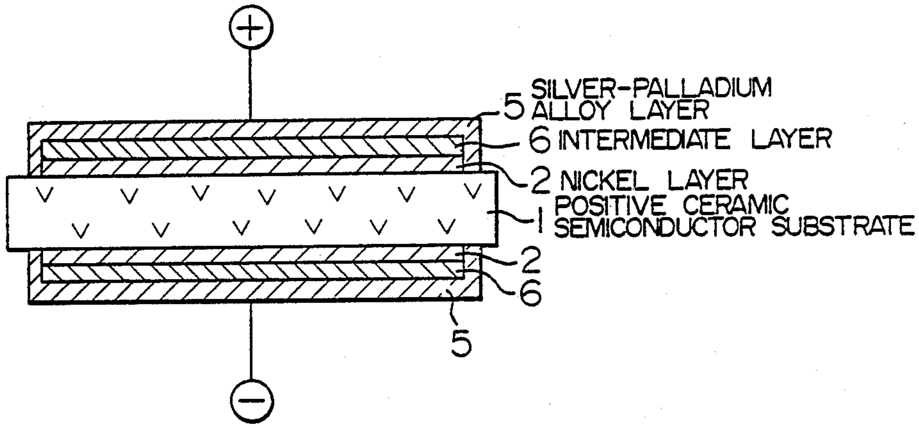
FIG. 10, FIG. 11, FIG. 12, FIG. 13 and FIG. 14 are vertical sectional views showing, respectively, electrode structures of positive ceramic semiconductor devices according to other modified embodiments of the present invention.

In FIG. 10, an ohmic-contacted electrically conductive layer is realized in a two-layer structure constituted by a nickel layer 2 formed directly on each surface of a positive ceramic semiconductor substrate 1 in ohmic contact therewith and an intermediate layer 6 of an electrically conductive metal material formed on the nickel layer 2, wherein the intermediate layer 6 is formed of the metal material having a high electric conductivity when compared with that of an electrically conductive layer 5 containing a silver-palladium alloy (hereinafter referred to as silver-palladium or Ag-Pd alloy layer). Thus, the positive and negative pole electrodes of the device shown in FIG. 10 are realized in a three-layer structure inclusive of the intermediate layer 6.

According to the instant embodiment under consideration, the intermediate layer 6 may be formed on one or more materials selected from a group consisting of silver, aluminum, tin and bronze.

When the intermediate layer 6 is to be formed of silver, it is required that the silver-palladium alloy layer 5 be so formed as to cover the whole peripheral edge portion of the intermediate layer 6 (refer to FIG. 10). If the outer peripheral edge portion of the intermediate layer 6 formed of silver is exposed, then the problem of the silver-migration will arise again. Of course, in practice, only partial exposure of the outer peripheral edge of the intermediate layer 6 in the course of manufacturing process gives rise to no problem so far as the exposure is within a tolerable range. On the other hand, when the intermediate layer 6 is formed of tin or bronze, it is not required to cover the whole outer peripheral edge of the intermediate layer 6 with the silver-palladium alloy layer 5, since the silver-migration phenomenon is difficult to occur with these materials.

Figure 11:
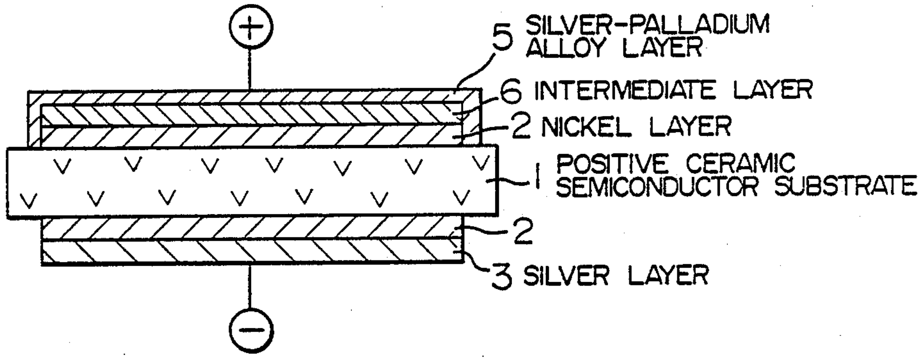

As a version of the instant embodiment under consideration, the electrode of the paired ones which is to serve as the negative pole may be of course realized in a two-layer structure including a nickel layer 2 formed directly on the substrate 1 in ohmic contact therewith and a silver layer 3 formed on the nickel layer 2, as is shown in FIG. 11.

As another version of the instant embodiment, the ohmic-contacted electrically conductive layer is not restricted to the two-layer structure but may be constituted by a single layer 7 ohmic-contacted to the substrate 1 and formed of a metal material having a high resistance as compared with that of the silver-palladium alloy layer. In that case, the positive pole electrode is of a two-layer structure. Although the negative pole electrode is of a two-layer structure in the device shown in FIG. 12, it goes without saying that this negative pole electrode can be realized in the structure shown in FIGS. 10 or 11. The metal material mentioned above may be selected from a group of materials including aluminum, tin, bronze and silver as main components thereof, respectively. The material containing silver as the main component may be added with one or more components selected from a group consisting of tin, antimony, zinc, aluminum and the like.

Figure 13:
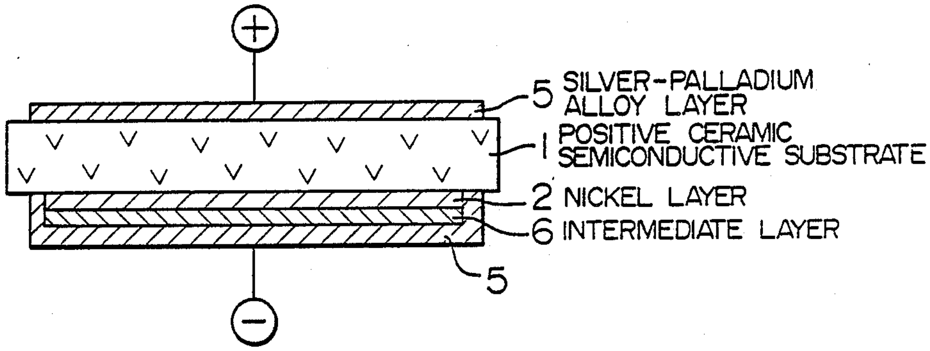

FIG. 13 shows another version of the embodiment shown in FIG. 10 according to which the positive pole electrode is constituted only by the single layer 5 of silver-palladium alloy. In this device shown in FIG. 13, the negative pole electrode is realized in a three-layer structure including a nickel layer 2 formed directly on the substrate 1 in ohmic contact therewith, an intermediate silver layer 6 formed on the nickel layer 2 so as to cover the outer peripheral edge of the nickel layer 2, and the silver-palladium alloy layer 5 formed on the intermediate layer 6.

Needless to say, the intermediate layer 6 shown in FIG. 13 may be formed of an element selected from a group of aluminum, tin and bronze in place of silver. Alternatively, a layer of a material or composition having in combination the characteristics of the intermediate layer 2 and the nickel layer 6 may be formed on the substrate and the silver-palladium is then formed on the abovementioned layer to thereby implement the negative pole electrode in a two-layer structure. In this manner, there can be realized the same electrode structure as the one shown in FIG. 12.

Figure 16:
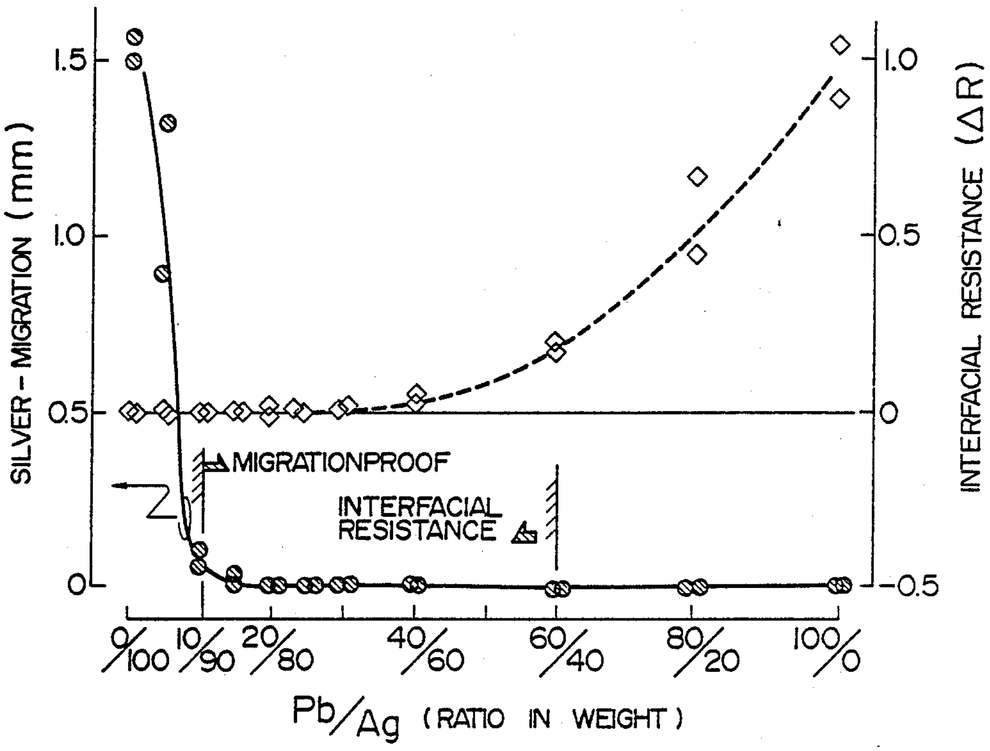

According to the embodiments under consideration, the composition of the silver-palladium alloy layer is so selected that the content of silver lies within a range of 40 wt. % to 90 wt. % while that of palladium is in a range of 60 wt. % to 10 wt. % As the content of palladium increases, the migrationproof property becomes increased as is illustrated in FIG. 16. In this context, it will be noted that when the content of palladium exceeds 10 wt. %, the silver-migration phenomenon takes place no more. In contrast, in the range of the palladium content greater than 40 wt. %, the interfacial resistance makes appearance between the positive ceramic semiconductor substrate and the electrode, involving reduction in the rush current, while the contact between the electrode and the substrate tends to assume the form of a point contact, providing a cause for the current concentration. Besides, cost of the device increases as a function of the content of palladium. Under the circumstances, it is desirable that the content of palladium be smaller than 60 wt. %.

Thus, the content of palladium of the silverpalladium series employed in the devices according to the embodiments described above should preferably be within a range of 10 wt. % to 60 wt. % and more preferably in a range of 20 wt. % to 30 wt. % from the standpoint of the reliability in performance and cost of manufacture.

Next, a method of manufacturing the positive ceramic semiconductor device according to the embodiment under consideration will be described below in detail.

Both surfaces of a ring-like positive ceramic semiconductor substrate (fired product) of a material belonging to barium-titanate series and manufactured by a conventional method are ground by an abrasive particulate material, e.g. abrasive particles of silicon carbide. After cleansing, the ground substrate is dried.

Subsequently, an activated paste containing palladium chloride which may be the one available under the trade name "K146" from Japan Kanizen Co. Ltd. is screen-printed over both surfaces of the substrate. After drying, the paste is baked at a temperature of 400° C. to 700° C.

After the baking, the substrate is immersed in a non-electrolyte plating bath of Ni-P series to be plated with nickel. Thereafter, firing is performed at a temperture of 200° C. to 450° C., to thereby form nickel layers on both surfaces of the substrate, respectively.

Subsequently, a silver paste is screen-printed on nickel layers formed on both surfaces of the substrate. After drying, the interim product is baked at 750° C. for 15 minutes. Thereafter, the sub-product is boiled in 1,1,2-trichloro-1,2,2-trifluoroethane commercially available under the trade name "DIFLON S3" for two minutes, being followed by cleansing and then drying at a temperature of 120° C. for 5 minutes.

Next, a paste containing silver particles of size not greater than 1 cm on an average and palladium particles of 800 Å on an average (the content of palladium is 20 wt. % in Ag-Pd series) is screen-printed on the silver layers on both surfaces of the substrate and fired or baked at a temperature of 600° C. for 15 minutes. Through this baking or firing process, silver and palladium are transformed to complete or integral solid solution forming a two-component alloy.

The structure of the positive ceramic semiconductor device obtained through the process described above is shown in FIG. 14.

Figure 14:
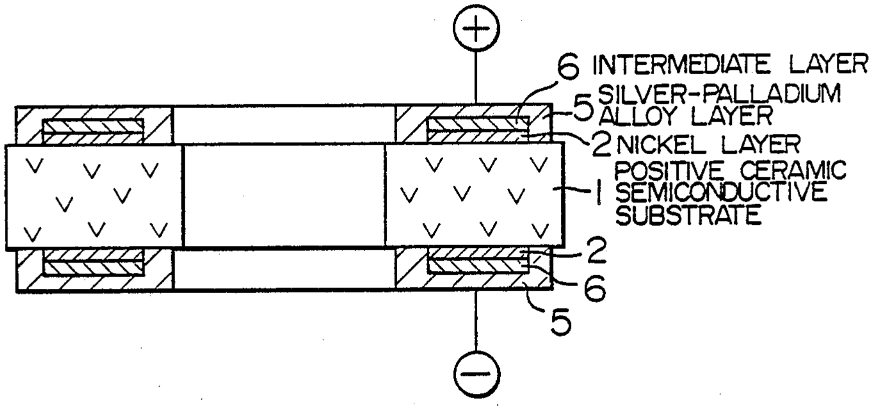

The mechanical strength of the semiconductor substrate of the device of the structure shown in FIG. 14 was examined comparatively with that of a specimen for reference. In the devices undergone the strength test, the substrate was of a ring-like shape having an outer diameter of 35.0 mm, an inner diameter of 25.0 mm and a thickness 2.5 mm and had a resistance of 1.5 Ω at a room temperature (20° C). On the other hand, the specimen for reference had positive and negative pole electrodes each of a two-layer structure including a nickel layer formed on the substrate and a Ag-Pd alloy layer (content of Pd is 20 wt. % in Ag-Pd series) formed on the nickel layer so as to cover the outer peripheral edge portion thereof.

The test was performed by applying a voltage of 24 V between the positive and negative pole electrodes for one minute and measuring the tensile strength (Kg.f) of the semiconductor substrate by means of an autograph device.

Figure 15:
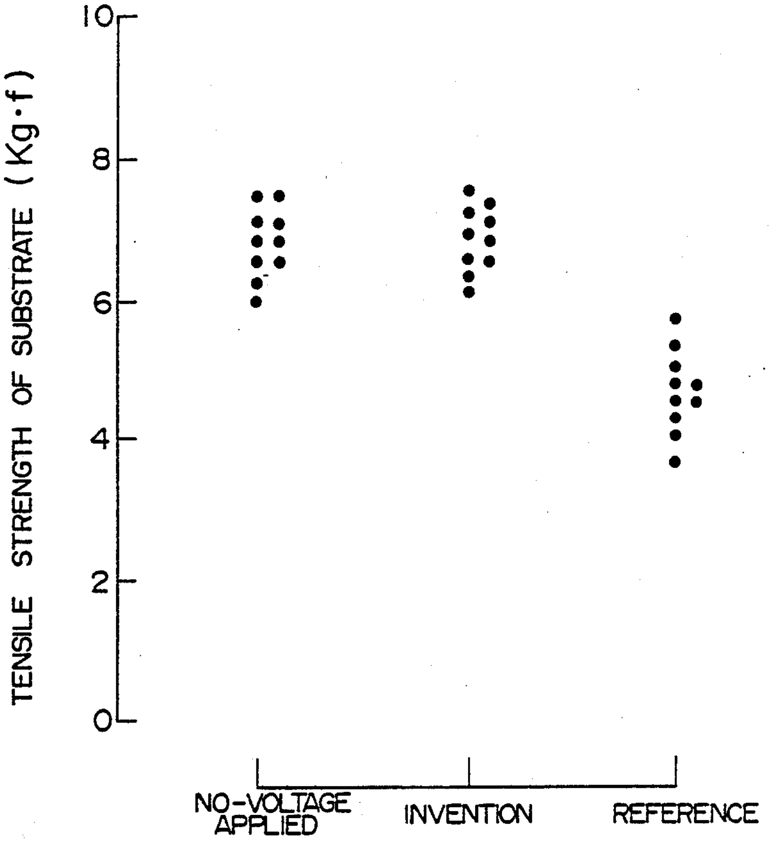
FIG. 15 and FIG. 16 are views showing characteristics of the positive ceramic semiconductor devices according to the other modified embodiments of the invention.

The results of the test are illustrated in FIG. 15 in which the data of strength derived from the devices undergone no voltage application are shown for comparison purpose. As will be seen from FIG. 15, the positive ceramic semiconductor device according to the embodiment of the invention has a high tensile strength as compared with the specimen for reference, which strength is on the substantially same order as that of the device undergone no voltage application. The test has thus proved that the positive ceramic semiconductor device according to the instant embodiment of the invention can enjoy an excellently high mechanical strength.

A plurality of specimens of the positive ceramic semiconductor devices manufactured through the process mentioned above in which the proportion of contents of silver and palladium was changed were examined in respect to the migrationproof property and the interfacial resistance. The results of the examination will be described below.

The specimens were implemented in the same configuration and dimensions as described above and subjected to a continuous current conduction withstanding test at a room temperature by applying a voltage of 14 V continuously for 2000 hours in an air ventilation at a flow rate of 20 g/sec.

The results of the test are illustrated in FIG. 16, in which distance (mm) covered by the migration is taken along the left-hand ordinate, while the interfacial resistance is taken along the right-hand ordinate. The interfacial resistance (Ω) was determined in accordance with the following expression:

$$\Delta R=(R_{Ni-Ag-Ag/Pd}R_{Ni})/R_{Ni}$$

where $R_{Ni}$ represents the resistance value of a positive ceramic substrate device (of the same configuration and geometrical dimensions) having positive and negative pole electrodes formed of nickel (baked at 300° C. for two hours), and $R_{Ni-Ag-Ag/Pd}$ represents the resistance value of the positive ceramic substrate device having the positive and negative pole electrodes each of the three layer structure including the nickel layer, the silver layer and the silver-palladium alloy layer as described hereinbefore in conjunction with the manufacturing method. In other words, the interfacial resistance (ΔR) represents in terms of ratio the difference between the resistance of the nickel electrode serving as a reference value and that of the electrode according to the invention.

It will be seen from FIG. 16 that significant change occurs in the migration phenomenon across a boundary corresponding to the content of palladium of 10 wt. % and that no migration phenomenon takes place in a range in which the content of palladium is not less than 10 wt. %.

The maximum coverage distance of migration is about 1.5 mm in the hitherto known positive ceramic semiconductor device, which means very poor performance of the device.

On the other hand, the interfacial resistance is increased progressively as the content of palladium increases beyond the ratio of about 40 wt. % with the rate of increasing in the interfacial resistance becoming significant when the content of palladium goes beyong 60 wt. %.

It should be noted that the interfacial resistance is definitely determined in dependence on the electrode structure of the positive ceramic semiconductor device. Accordingly, the aforementioned expression holds true for the positive ceramic semiconductor device shown in FIG. 14 since this device differs from the one shown in FIG. 15 only in respect to the geometrical configuration. However, in the case of the positive ceramic semiconductor substrate shown in FIG. 11 in particular, the relevant resistance value must be substituted for $R_{Ni-Ag/Pd}$ in the aforementioned expression.

Figure 12:
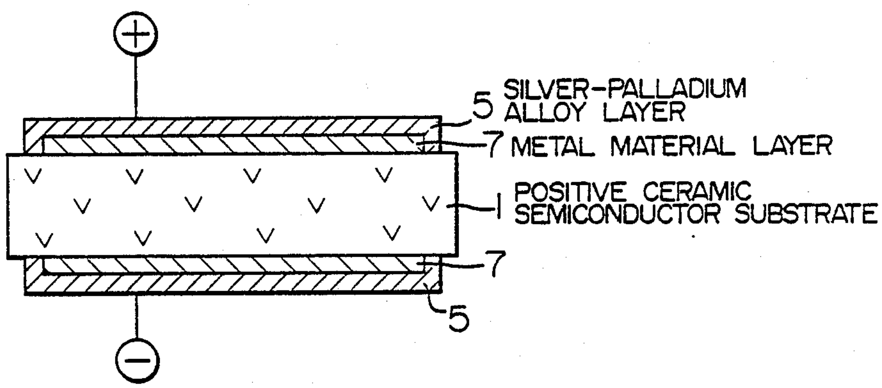

Thus, the characteristic curves of the interfacial resistance of the positive ceramic semiconductor devices shown in FIGS. 11 and 12 differ from the one illustrated in FIG. 16. However, the content ratio of 60 wt. % defining the upper limit of the allowable palladium content range delimited due to the interfacial resistance applies valid to the device shown in FIG. 14. In the case of the embodiment shown in FIG. 13, the electrode structure is non-ohmic without incorporating the Ni-layer. Thus, it is impossible to measure the interfacial resistance. Accordingly, the interfacial resistance was determined on the basis of the rush current, from which it has been found that the content ratio of 60 wt. % of palladium defines the upper limit of the allowable content range for palladium also in the case of this embodiment.

The instant embodiment is susceptible to various versions as in the case of those described hereinbefore and can assure advantageous effects similar to those attained by the basic embodiment. In a version of the instant embodiment, a modification mentioned below may be effectuated.

(7) Although it has been described that the silver layer (intermediate layer) and the silver-palladium alloy are formed on the nickel layer through two discrete firing or baking processes, it is possible to form those layers through a single baking process by appropriately selecting the material of the intermediate layer, the baking temperature, the baking duration and other factors.

Next, a further modified embodiment of the present invention will be described, which embodiment is also intended to avoid the lowering in the mechanical strength of the positive ceramic semiconductor substrate.

After intensive and extensive studies performed for making clear the cause for the unwanted lowering of the mechanical strength of the substrate mentioned above, the following fact has been found.

In the electrode constituted by at least an electrically conductive alloy material containing silver and palladium, silver is usually covered with an oxide film. In this connection, it is noted that the oxide film, i.e. silver oxide is a p-type semiconductor. In contrast, the positive ceramic semiconductor substrate is an n-type semiconductor. Thus, the boundary interface where the oxide film and the substrate are contacted with each other forms a p-n hetero-junction. Consequently, the electrode formed by using the material mentioned above presents non-ohmic contact to the positive ceramic semiconductor substrate.

Figure 17:
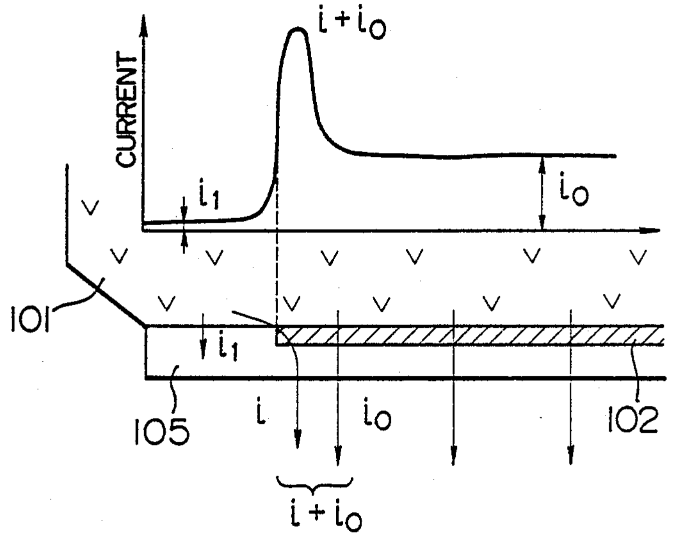
FIG. 17 is a view for illustrating problems of the positive ceramic semiconductor device.

More sepcifically, as shown in FIG. 17, when the negative pole electrode to be provide on the positive ceramic semiconductor substrate 101 is realized in a two-layer structure including a nickel layer formed on the substrate 101 in ohmic contact therewith and the aforementioned silver-palladium layer containing silver and palladium which is formed on the nickel layer 102 and the substrate 101 so as to cover the outer peripheral edge portion of the nickel layer 102, a current $i_0$ which should inherently flow through the non-ohmic contact portions of the silver-palladium layer 105 and the substrate 101 is suppressed to a current value $i_l$ which is extremly smaller than $i_0$.

Consequently, a current i in excess (i.e. current value of $i_0$ minus $i_l$) flows through the outer peripheral edge of the nickel layer 102 ohmic-contacted to the nickel layer, as the result of which a localized heat generation occurs at the outer peripheral edge of the nickel layer 102 due to the excessive current flow of $i+i_0$.

The fact that the tendency of localized heat generation is observed significantly in the negative pole electrode has been confirmed by emans of an infrared temperature analyzer (also called thermoviewer).

Due to the local heat generation metnioned above, temperature of the substrate 101 is locally increased, bringing about a correspondingly increased resistance in the locally heated region. Under the cirumstance, the concentration of electric current is involved to increase further the temperature, giving rise to generation of cracks and hence degradation in the mehcanical strength of the substrate.

Figure 18:
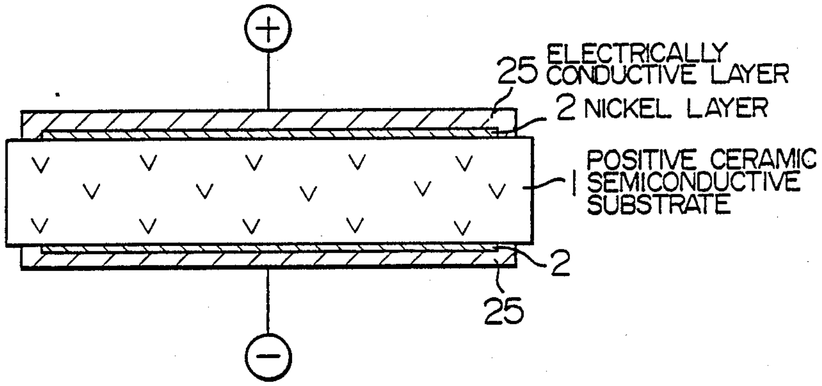
FIG. 18, FIG. 19 and FIG. 20 are vertical sectional views showing, respectively, electrode structures of positive ceramic semiconductor devices according to further modified embodiments of the present invention.
Figure 19:
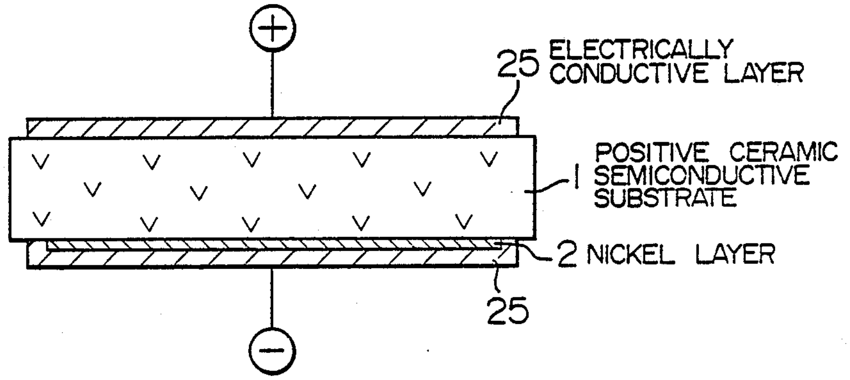
Figure 20:
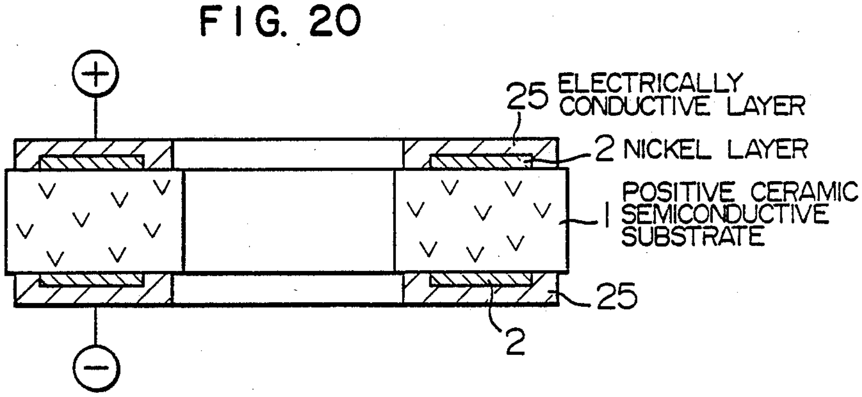
Figure 21:
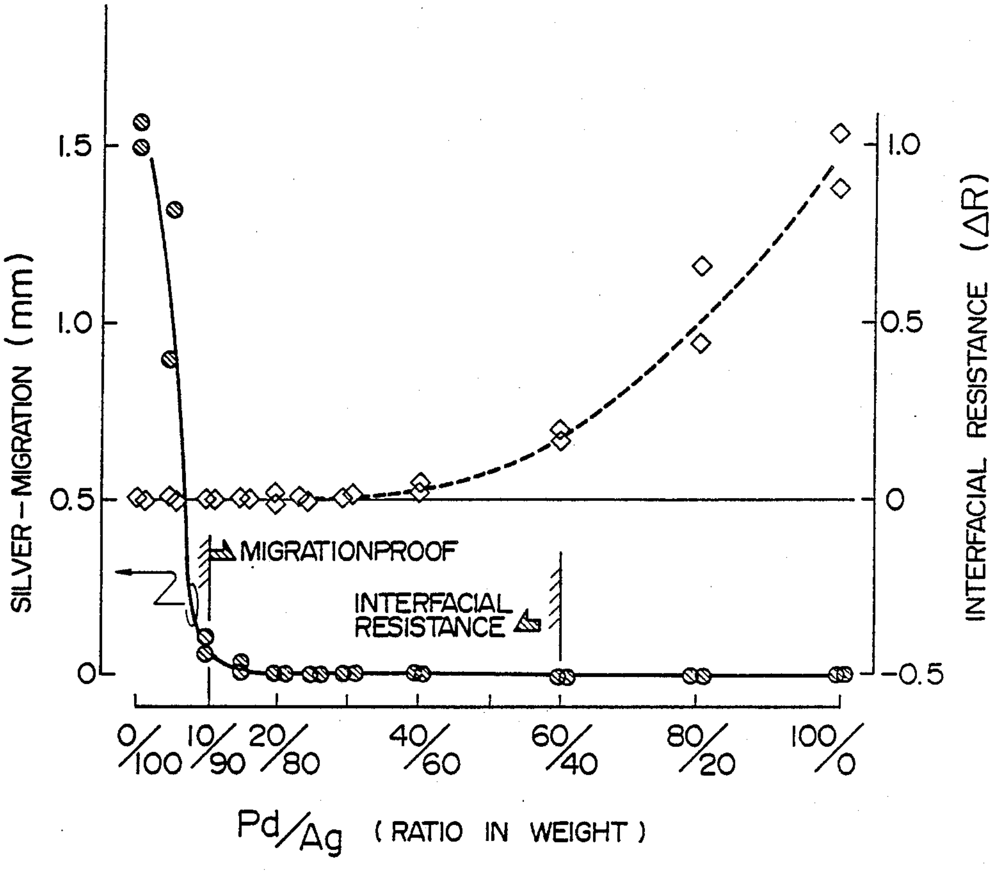
FIG. 21 is a view showing characteristics of the positive ceramic semiconductor devices according to the further modified embodiments of the invention for illustrating action and effects thereof.

Now, the embodiment of the invention made with the aim for tackling the above problem will be described in detail. FIGS. 18 to 20 are sectional views showing positive ceramic semiconductor devices according to the instant embodiment. In these figures, same or like elements are denoted by same reference symbols.

First referring to FIG. 18, the semiconductor device comprises a positive ceramic semiconductor substrate 1 having each surface formed with a nickel layer 2 in ohmic contact therewith and an electrically conductive layer 25 containing silver, palladium and a base metal and formed on the nickel layer 2 so as to cover the peripheral edge thereof. The substrate 1 is formed of a material belonging to barium-titanate series having a positive temperature coefficient of resistance and a Curie point at which the resistance value increases steeply at a predetermined temperature.

In the semiconductor device shown in FIG. 19, the positive pole electrode is realized in a single layer structure constituted only by the aforementioned electrically conductive layer 25, while the negative pole electrode is realized in a same structure as that of the device shown in FIG. 18.

In the semiconductor device shown in FIG. 20, the positive ceramic semiconductor device 1 is configured in a ring-like structure in contrast to the disk-like structures of the devices shown in FIGS. 18 and 19. The electrode structure is same as that of the device shown in FIG. 18.

Now, a method of manufacturing the positive ceramic semiconductor device according to the instant embodiment will be described on the assumption that the method is applied to the manufacturing of the device shown in FIG. 20.

Both surfaces of a ring-like positive ceramic semiconductor substrate (fired product) of a material belonging to barium-titanate series and manufactured by a conventional method are ground by an abrasive particulate material, e.g. abrasive particles of silicon carbide. After cleansing, the ground substrate is dried.

Subsequently, an activated paste containing palladium chloride which may be the one commercially available under the trade name "K146" from Japan Kanizen Co. Ltd. is screen-printed over both surfaces of the substrate. After drying, the paste is baked at a temperature of 400° C. to 700° C.

After the baking, the substrate is immersed in a non-electrolyte plating bath of Ni-P series to be plated with nickel. Thereafter, firing is performed at a temperature of 200° C. to 450° C., to thereby form nickel layers on both surfaces of the substrate, respectively.

An Ag-Pd-base metal powder mixture containing silver (Ag) powder and palladium (Pd) powder and added with one of pulverized tin (Sn), indium (In) and/or gallium (Ga), nickel (Ni), antimony (Sb) and aluminum (Al) is prepared and added with glass frits to prepare an Ag-Pd-base metal paste by a conventional method.

The paste thus prepared is then screen-printed on the nickel layer of the substrate and baked at a temperature of 600° C. for 15 minutes in a baking furnace to form the electrically conductive layer of the Ag-Pd-base metal series.

The structure of the positive ceramic semiconductor device manufacture through the processed described above is shown in FIG. 20.

A plurality of specimens of the positive ceramic semiconductor devices prepared according to the method described above and in which types of base metals as well as amounts of addition and the content ratios of silver and palladium are varied from one to another were prepared and tested in respect to the interfacial resistance, the migrationproof property, the strength of the positive ceramic semiconductor substrate and the moistureproof property, the results of the test being shown in the tables 1 to 5.

Each of the specimens is 35 mm in outer diameter, 25 mm in inner diameter and 2.5 mm in thickness and has a resistance of 1.5 Ω at a room temperature (20° C.). With regard to the electrode structures of the specimens, the nickel layer is 33 mm in outer diameter, 27 mm in inner diameter while the electrically conductive layer formed on the nickel layer is 35 mm in outer diameter and 25 mm in inner diameter.

Methods for evaluating the specimens are as follows:

Concerning Interfacial Resistance

This interfacial resistance is given in terms of ratio by difference between the resistance of the electrode structure of the specimen and that of the nickel-silver layer serving as the reference value and expressed by $$\Delta R=(R_S-R_{Ni-Ag})/R_{Ni-Ag}$$

where $R_S$ represents the resistance of the semiconductor device of the specimen and $R_{Ni-Ag}$ represents the resistance of the conventional (prior art) semiconductor device provided with the negative and positive pole electrodes of the two-layer structure including the nickel and silver layers. It should be mentioned that in the conventional semiconductor device, the dimensions of the electrodes and semiconductor substrate are same as those of the specimens Criterion for the evaluation is so established that the devices having R greater than 0.2 inclusive is regarded as being good, as indicated by a circle while the devices having ΔR smaller than 0.2 is regarded as being bad as indicated by a cross X.

Concerning Strength of Substrate

The specimen was tested with respect to the tensile strength by applying tension at an increasing rate of 5 mm/min by using an autograph device after a voltage of 24 V had been applied across the positive and negative pole electrodes for one minute. The criterion for evaluation is so established that when the ratio of defective devices having the strength not greater than 6 Kg.f is 0% among ten specimens (n=10), the specimen is regarded as good, as indicated by a circle while the specimen having the defective ratio greater than 0% is regarded to be poor, as indicated by a cross X.

Concerning Migration

Each device was held in an air stream of an air flow of 20 g/sec with a voltage of 14 V applied across the positive and negative poles for 2000 hours, and the maximum distance covered by the migration was measured. The criterion for evaluation to this end is so established that the specimens in which the maximum migration distance is less than 0.1 mm are regarded as good and indicated by a circle while those having the maximum migration coverage greater than 0.1 mm is regarded to be poor and indicated by the cross X.

Concerning Moistureproof Property

Change (%) in the resistance measured before and after boiling of the specimen in water for two hours was measured. This change in resistance is given by $$\Delta R=(R_{boiled}-R_{initial})/R_{initial}\times 100\%$$

Criterion for evaluation is so established that the specimen presenting ΔR smaller than ±3% inclusive is regarded to be good and indicated by a circle, while those presenting ΔR greater than ±3% are regarded as being bad, as indicated by the cross X.

TABLE 1

| No. | Electrode composition Ag/Pd Ratio of wt. | Electrode composition Sn wt % | Inter-facial resist-ance | | Substrate strength (at 24 V) | | Migration mm | | Moisture-proof property % | | Evaluation | Remarks |
|---|---|---|---|---|---|---|---|---|---|---|---|---|
| 1 | 100/0 | 0 | 0 | o | 0/10 | o | 1.55 | x | +0.2 | o | x | Prior art |
| 2 | 95/5 | 0 | ↑ | o | 0/10 | o | 1.24 | x | +0.4 | o | x | For reference |
| 3 | 90/10 | 0 | ↑ | o | 1/10 | x | 0.09 | o | +2.1 | o | x | ↑ |
| 4 | 80/20 | 0 | ↑ | o | 4/10 | x | 0 | o | −0.1 | o | x | ↑ |
| 5 | 60/40 | 0 | 0.04 | o | 10/10 | x | ↑ | o | −0.2 | o | x | ↑ |
| 6 | 40/60 | 0 | 0.18 | o | 9/10 | x | ↑ | o | +0.7 | o | x | ↑ |
| 7 | 20/80 | 0 | 0.53 | x | 10/10 | x | ↑ | o | +0.5 | o | x | ↑ |
| 8 | 80/20 | 2.5 | 0 | o | 1/10 | x | ↑ | o | +0.1 | o | x | For comparison |
| 9 | ↑ | 5 | ↑ | o | 0/10 | o | ↑ | o | −0.7 | o | o | Invention |
| 10 | ↑ | 10 | ↑ | o | 0/10 | o | ↑ | o | +0.5 | o | o | ↑ |
| 11 | ↑ | 20 | ↑ | o | 0/10 | o | ↑ | o | +0.3 | o | o | ↑ |
| 12 | ↑ | 40 | ↑ | o | 0/10 | o | ↑ | o | +1.5 | o | o | ↑ |
| 13 | 80/20 | 60 | 0 | o | 0/10 | o | 0 | o | +2.8 | o | o | Invention |
| 14 | ↑ | 80 | ↑ | o | 0/10 | o | ↑ | o | +7.8 | x | x | For comparison |
| 15 | 95/5 | 20 | ↑ | o | 0/10 | o | 0.85 | x | +0.5 | o | x | ↑ |
| 16 | 90/10 | ↑ | ↑ | o | 0/10 | o | 0.04 | o | −0.1 | o | o | Invention |
| 17 | 60/40 | ↑ | 0.02 | o | 0/10 | o | 0 | o | −0.3 | o | o | ↑ |
| 18 | 40/60 | ↑ | 0.11 | o | 0/10 | o | ↑ | o | +0.8 | o | o | ↑ |
| 19 | 20/80 | ↑ | 0.34 | x | 5/10 | x | ↑ | o | +0.4 | o | x | For comparison |
| 20 | 40/60 | 40 | 0.07 | o | 0/10 | o | ↑ | o | +1.9 | o | o | Invention |
| 21 | 20/80 | ↑ | 0.24 | x | 2/10 | x | ↑ | o | +1.3 | o | x | For comparison |

TABLE 2-1

| No. | Electrode composition Ag/Pd Ratio of wt. | Electrode composition *In/Ga wt % | Inter-facial resist-ance | | Substrate strength (at 24 V) | | Migration mm | | Moisture-proof property % | | Evaluation | Remarks |
|---|---|---|---|---|---|---|---|---|---|---|---|---|
| 1 | 100/0 | 0 | 0 | o | 0/10 | o | 1.55 | x | +0.2 | o | x | Prior art |
| 2 | 95/5 | 0 | ↑ | o | 0/10 | o | 1.24 | x | +0.4 | o | x | For reference |
| 3 | 90/10 | 0 | ↑ | o | 1/10 | x | 0.09 | o | +2.1 | o | x | ↑ |
| 4 | 80/20 | 0 | ↑ | o | 4/10 | x | 0 | o | −0.1 | o | x | ↑ |
| 5 | 60/40 | 0 | 0.04 | o | 10/10 | x | ↑ | o | −0.2 | o | x | ↑ |
| 6 | 40/60 | 0 | 0.18 | o | 9/10 | x | ↑ | o | +0.7 | o | x | ↑ |
| 7 | 20/80 | 0 | 0.53 | x | 10/10 | x | ↑ | o | +0.5 | o | x | ↑ |
| 8 | 80/20 | 1 | 0 | o | 2/10 | x | ↑ | o | −0.4 | o | x | For comparison |
| 9 | ↑ | 2.5 | ↑ | o | 0/10 | o | ↑ | o | +0.1 | o | o | Invention |
| 10 | ↑ | 5 | ↑ | o | 0/10 | o | ↑ | o | −0.2 | o | o | ↑ |
| 11 | ↑ | 10 | ↑ | o | 0/10 | o | ↑ | o | +1.1 | o | o | ↑ |
| 12 | ↑ | 20 | ↑ | o | 0/10 | o | ↑ | o | −0.2 | o | o | ↑ |
| 13 | 80/20 | 30 | 0 | o | 0/10 | o | 0 | o | +1.0 | o | o | Invention |
| 14 | ↑ | 40 | ↑ | o | 0/10 | o | ↑ | o | +2.1 | o | o | ↑ |
| 15 | ↑ | 50 | ↑ | o | 0/10 | o | ↑ | o | +2.7 | o | o | ↑ |
| 16 | ↑ | 60 | ↑ | o | 0/10 | o | ↑ | o | +8.6 | x | x | For comparison |
| 17 | 95/5 | 20 | ↑ | o | 0/10 | o | 0.87 | x | +0.5 | o | x | ↑ |
| 18 | 90/10 | ↑ | ↑ | o | 0/10 | o | 0.08 | o | −0.1 | o | o | Invention |
| 19 | 60/40 | ↑ | 0.04 | o | 0/10 | o | 0 | o | +0.2 | o | o | ↑ |
| 20 | 40/60 | ↑ | 0.14 | o | 0/10 | o | ↑ | o | +0.2 | o | o | ↑ |
| 21 | 20/80 | ↑ | 0.29 | x | 0/10 | o | ↑ | o | +0.4 | o | x | For comparison |
| 22 | 40/60 | 30 | 0.12 | o | 0/10 | o | ↑ | o | +1.1 | o | o | Invention |
| 23 | 20/80 | ↑ | 0.20 | o | 0/10 | o | ↑ | o | +1.5 | o | o | ↑ |

TABLE 2-1-continued

| No. | Electrode composition Ag/Pd Ratio of wt. | *In/Ga wt % | Inter-facial resist-ance | | Substrate strength (at 24 V) | | Migration mm | | Moisture-proof property % | | Evaluation | Remarks |
|---|---|---|---|---|---|---|---|---|---|---|---|---|
| 24 | 40/60 | 40 | 0.08 | o | 0/10 | o | ↑ | o | +2.8 | o | o | ↑ |

*In/Ga is an alloy of 25 wt. % of In and 75 wt. % of Ga

TABLE 2-2

| No. | Electrode composition Ag/Pd Ratio in wt. | In/Ga wt % | In/Ga Composi-tion | Inter-facial resist-ance | | Substrate strength (at 24 V) | | Migration mm | | Moisture-proof property % | | Evaluation | Remarks |
|---|---|---|---|---|---|---|---|---|---|---|---|---|---|
| 25 | 80/20 | 1 | 100/0 | 0.15 | o | 8/10 | x | 0 | o | +0.2 | o | x | For comparison |
| 26 | ↑ | 2.5 | ↑ | 0.04 | o | 4/10 | x | ↑ | o | −0.1 | o | x | ↑ |
| 27 | ↑ | 10 | ↑ | 0.04 | o | 0/10 | o | ↑ | o | +0.3 | o | o | Invention |
| 28 | ↑ | 20 | ↑ | 0 | o | ↑ | o | ↑ | o | +1.4 | o | o | ↑ |
| 29 | ↑ | 50 | ↑ | ↑ | o | ↑ | o | ↑ | o | +3.7 | x | x | For comparison |
| 30 | ↑ | 60 | ↑ | ↑ | o | ↑ | o | ↑ | o | +10.6 | x | x | ↑ |
| 31 | ↑ | 1 | 75/25 | 0.08 | o | 3/10 | x | ↑ | o | +0.4 | o | x | ↑ |
| 32 | ↑ | 2.5 | ↑ | 0.02 | o | 1/10 | x | ↑ | o | +0.3 | o | o | Invention |
| 33 | ↑ | 10 | ↑ | 0 | o | 0/10 | o | ↑ | o | +0.1 | o | o | ↑ |
| 34 | ↑ | 20 | ↑ | ↑ | o | ↑ | o | ↑ | o | +0.1 | o | o | ↑ |
| 35 | ↑ | 50 | ↑ | ↑ | o | ↑ | o | ↑ | o | +2.6 | o | o | ↑ |
| 36 | ↑ | 60 | ↑ | ↑ | o | ↑ | o | ↑ | o | +3.5 | x | x | For comparison |
| 37 | 80/20 | 1 | 50/50 | 0.01 | o | 2/10 | x | 0 | o | +0.2 | o | x | For comparison |
| 38 | ↑ | 2.5 | ↑ | 0 | o | 0/10 | o | ↑ | o | −0.4 | o | o | Invention |
| 39 | ↑ | 10 | ↑ | ↑ | o | ↑ | o | ↑ | o | −0.1 | o | o | ↑ |
| 40 | ↑ | 20 | ↑ | ↑ | o | ↑ | o | ↑ | o | +0.2 | o | o | ↑ |
| 41 | ↑ | 50 | ↑ | ↑ | o | ↑ | o | ↑ | o | +1.5 | o | o | ↑ |
| 42 | ↑ | 60 | ↑ | ↑ | o | ↑ | o | ↑ | o | +3.1 | x | x | For comparison |
| 43 | ↑ | 1 | 0/100 | ↑ | o | 2/10 | x | ↑ | o | +0.5 | o | x | ↑ |
| 44 | ↑ | 2.5 | ↑ | ↑ | o | 0/10 | o | ↑ | o | +0.4 | o | o | Invention |
| 45 | ↑ | 10 | ↑ | ↑ | o | ↑ | o | ↑ | o | −0.5 | o | o | ↑ |
| 46 | ↑ | 20 | ↑ | ↑ | o | ↑ | o | ↑ | o | +0.8 | o | o | ↑ |
| 47 | ↑ | 50 | ↑ | ↑ | o | ↑ | o | ↑ | o | +2.1 | o | o | ↑ |
| 48 | ↑ | 60 | ↑ | ↑ | o | ↑ | o | ↑ | o | +4.2 | x | x | For comparison |

TABLE 3

| No. | Electrode composition Ag/Pd Ratio in wt. | Ni wt % | Inter-facial resist-ance | | Substrate strength (at 24 V) | | Migration mm | | Moisture-proof property % | | Evaluation | Remarks |
|---|---|---|---|---|---|---|---|---|---|---|---|---|
| 1 | 100/0 | 0 | 0 | o | 0/10 | o | 1.55 | x | +0.2 | o | x | Prior art |
| 2 | 95/5 | 0 | ↑ | o | 0/10 | o | 1.24 | x | +0.4 | o | x | For reference |
| 3 | 90/10 | 0 | ↑ | o | 1/10 | x | 0.09 | o | +2.1 | o | x | ↑ |
| 4 | 80/20 | 0 | ↑ | o | 4/10 | x | 0 | o | −0.1 | o | x | ↑ |
| 5 | 60/40 | 0 | 0.04 | o | 10/10 | x | ↑ | o | −0.2 | o | x | ↑ |
| 6 | 40/60 | 0 | 0.18 | o | 9/10 | x | ↑ | o | +0.7 | o | x | ↑ |
| 7 | 20/80 | 0 | 0.53 | x | 10/10 | x | ↑ | o | +0.5 | o | x | ↑ |
| 8 | 80/20 | 5 | 0 | o | 2/10 | x | ↑ | o | +0.3 | o | x | For comparison |
| 9 | ↑ | 10 | ↑ | o | 0/10 | o | ↑ | o | +0.2 | o | o | Invention |
| 10 | ↑ | 20 | ↑ | o | ↑ | o | ↑ | o | +0.2 | o | o | ↑ |
| 11 | ↑ | 30 | ↑ | o | ↑ | o | ↑ | o | +0.8 | o | o | ↑ |
| 12 | ↑ | 40 | ↑ | o | ↑ | o | ↑ | o | +1.5 | o | o | ↑ |
| 13 | 80/20 | 50 | 0 | o | 0/10 | o | 0 | o | +2.8 | o | o | Invention |
| 14 | ↑ | 60 | ↑ | o | ↑ | o | ↑ | o | +2.9 | o | o | ↑ |
| 15 | ↑ | 70 | ↑ | o | ↑ | o | ↑ | o | +10.5 | x | x | For comparison |
| 16 | 95/5 | 30 | ↑ | o | ↑ | o | 0.92 | x | +0.2 | o | x | ↑ |
| 17 | 90/10 | ↑ | ↑ | o | ↑ | o | 0.07 | o | +0.2 | o | o | Invention |
| 18 | 60/40 | ↑ | 0.03 | o | ↑ | o | 0 | o | +0.5 | o | o | ↑ |
| 19 | 40/60 | ↑ | 0.12 | o | 2/10 | x | ↑ | o | +0.7 | o | x | For comparison |
| 20 | 20/80 | ↑ | 0.27 | x | 2/10 | x | ↑ | o | +0.3 | o | x | ↑ |
| 21 | 60/40 | 50 | 0.02 | o | 0/10 | o | ↑ | o | +2.5 | o | o | Invention |
| 22 | 40/60 | ↑ | 0.05 | o | 0/10 | o | ↑ | o | +2.7 | o | o | ↑ |
| 23 | 20/80 | ↑ | 0.20 | o | 0/10 | o | ↑ | o | +2.7 | o | o | ↑ |
| 24 | ↑ | 60 | 0.17 | o | 0/10 | o | ↑ | o | +2.6 | o | o | ↑ |

TABLE 4

| No. | Electrode composition Ag/Pd Ratio in wt. | Sb wt % | Interfacial resistance | | Substrate strength (at 24 V) | | Migration mm | | Moisture-proof property % | | Evaluation | Remarks |
|---|---|---|---|---|---|---|---|---|---|---|---|---|
| 1 | 100/0 | 0 | 0 | o | 0/10 | o | 1.55 | x | +0.2 | o | x | Prior art |
| 2 | 95/5 | ↑ | ↑ | o | 0/10 | o | 1.24 | x | +0.4 | o | x | For reference |
| 3 | 90/10 | ↑ | ↑ | o | 1/10 | x | 0.09 | o | +2.1 | o | x | ↑ |
| 4 | 80/20 | ↑ | ↑ | o | 4/10 | x | ≈0 | o | −0.1 | o | x | ↑ |
| 5 | 60/40 | ↑ | 0.04 | o | 10/10 | x | ↑ | o | −0.2 | o | x | ↑ |
| 6 | 40/60 | ↑ | 0.18 | o | 9/10 | x | ↑ | o | +0.7 | o | x | ↑ |
| 7 | 20/80 | ↑ | 0.53 | x | 10/10 | x | ↑ | o | +0.5 | o | x | ↑ |
| 8 | 80/20 | 1 | 0 | o | 2/10 | x | ↑ | o | +0.2 | o | x | For comparison |
| 9 | ↑ | 2.5 | ↑ | o | 0/10 | o | ↑ | o | −0.1 | o | o | Invention |
| 10 | ↑ | 5 | ↑ | o | 0/10 | o | ↑ | o | −0.5 | o | o | ↑ |
| 11 | ↑ | 10 | ↑ | o | 0/10 | o | ↑ | o | +0.2 | o | o | ↑ |
| 12 | ↑ | 20 | ↑ | o | 0/10 | o | ↑ | o | −0.1 | o | o | ↑ |
| 13 | 80/20 | 40 | 0 | o | 0/10 | o | 0 | o | +1.5 | o | o | Invention |
| 14 | ↑ | 60 | ↑ | o | 0/10 | o | ↑ | o | +2.6 | o | o | ↑ |
| 15 | ↑ | 70 | ↑ | o | 0/10 | o | ↑ | o | +12.5 | x | x | For comparison |
| 16 | ↑ | 80 | ↑ | o | 0/10 | o | ↑ | o | +18.9 | x | x | ↑ |
| 17 | 95/5 | 20 | ↑ | o | 0/10 | o | 1.14 | x | +0.2 | o | x | ↑ |
| 18 | 90/10 | ↑ | ↑ | o | 0/10 | o | 0.06 | o | +0.4 | o | o | Invention |
| 19 | 60/40 | ↑ | 0.04 | o | 0/10 | o | ≈0 | o | +0.1 | o | o | ↑ |
| 20 | 40/60 | ↑ | 0.17 | o | 0/10 | o | ↑ | o | +0.3 | o | o | ↑ |
| 21 | ↑ | 40 | 0.11 | o | 0/10 | o | ↑ | o | +1.4 | o | o | ↑ |
| 22 | 20/80 | 20 | 0.44 | x | 3/10 | x | ↑ | o | +0.5 | o | x | For comparison |
| 23 | ↑ | 40 | 0.28 | x | 0/10 | o | ↑ | o | +2.9 | o | x | ↑ |
| 24 | ↑ | 60 | 0.19 | o | 0/10 | o | ↑ | o | +2.7 | o | o | Invention |

TABLE 5

| No. | Electrode composition Ag/Pd Ratio in wt. | Al wt % | Interfacial resistance | | Substrate strength (at 24 V) | | Migration mm | | Moisture-proof property % | | Evaluation | Remarks |
|---|---|---|---|---|---|---|---|---|---|---|---|---|
| 1 | 100/0 | 0 | 0 | o | 0/10 | o | 1.55 | x | +0.2 | o | x | Prior art |
| 2 | 95/5 | ↑ | ↑ | o | 0/10 | o | 1.24 | x | +0.4 | o | x | For reference |
| 3 | 90/10 | ↑ | ↑ | o | 1/10 | x | 0.09 | o | +2.1 | o | x | ↑ |
| 4 | 80/20 | ↑ | ↑ | o | 4/10 | x | ≈0 | o | −0.1 | o | x | ↑ |
| 5 | 60/40 | ↑ | 0.04 | o | 10/10 | x | ↑ | o | −0.2 | o | x | ↑ |
| 6 | 40/60 | ↑ | 0.18 | o | 9/10 | x | ↑ | o | +0.7 | o | x | ↑ |
| 7 | 20/80 | ↑ | 0.53 | x | 10/10 | x | ↑ | o | +0.5 | o | x | ↑ |
| 8 | 80/20 | 2.5 | 0 | o | 1/10 | x | ↑ | o | +0.8 | o | x | For comparison |
| 9 | ↑ | 5 | ↑ | o | 0/10 | o | ↑ | o | +0.2 | o | o | Invention |
| 10 | ↑ | 10 | ↑ | o | 0/10 | o | ↑ | o | +0.5 | o | o | ↑ |
| 11 | ↑ | 20 | ↑ | o | 0/10 | o | ↑ | o | +1.1 | o | o | ↑ |
| 12 | ↑ | 30 | ↑ | o | 0/10 | o | ↑ | o | +0.8 | o | o | ↑ |
| 13 | 80/20 | 40 | 0 | o | 0/10 | o | 0 | o | +1.5 | o | o | Invention |
| 14 | ↑ | 50 | ↑ | o | 0/10 | o | ↑ | o | +0.5 | o | o | ↑ |
| 15 | ↑ | 60 | ↑ | o | 0/10 | o | ↑ | o | +1.7 | o | o | ↑ |
| 16 | ↑ | 70 | ↑ | o | 0/10 | o | ↑ | o | +2.8 | o | o | ↑ |
| 17 | ↑ | 80 | ↑ | o | 0/10 | o | ↑ | o | +7.6 | x | x | For comparison |
| 18 | 95/5 | 50 | ↑ | o | 0/10 | o | 0.95 | x | +1.7 | o | x | ↑ |
| 19 | 90/10 | ↑ | ↑ | o | 0/10 | o | 0.05 | o | +0.8 | o | o | Invention |
| 20 | 60/40 | ↑ | 0.03 | o | 0/10 | o | ≈0 | o | +2.0 | o | o | ↑ |
| 21 | 40/60 | ↑ | 0.14 | o | 0/10 | o | ↑ | o | +2.0 | o | o | ↑ |
| 22 | 20/80 | ↑ | 0.42 | x | 0/10 | o | ↑ | o | +2.5 | o | x | For comparison |
| 23 | ↑ | 60 | 0.26 | x | 0/10 | o | ↑ | o | +2.1 | o | x | ↑ |
| 24 | ↑ | 70 | 0.17 | o | 0/10 | o | ↑ | o | +2.9 | o | o | Invention |

As is obvious from the tables 1 to 5, the strength of the ceramic semiconductor substrate can be increased by forming the electrically conductive layer of a material containing Sn, In and/or Ga, Ni, Sb, and/or Al in addition to Ag and Pd.

The interfacial resistance and the moistureproof property are susceptible to the influence of the content of base metal such as Sn and others. These characteristics may be determined in dependence on the applications to which the positive ceramic semiconductor device is intended.

The amounts (in percent by weight) of base metals contained in the electrically conductive layer should perferably be so selected that tin is from 5 wt. % to 60 wt. %, indium is from 2.5 wt. % to 50 wt. %, gallium is from 2.5 wt.% to 50 wt.%, indium-gallium alloy is from 2.5 wt. % to 50 wt. %, nickel from 10 wt. % to 60 wt. %, antimony is from 2.5 wt. % to 60 wt. %, and aluminum is from 5 wt. % to 70 wt. %.

In the ceramic semiconductor device according to the instant embodiment under consideration, the positive pole electrode may be realized in a two-layer structure constituted by a silver-palladium layer containing at least silver and palladium and an electrically conductive layer ohmic-contacted to the positive ceramic semiconductor substrate. Alternatively, the positive pole electrode may be realized in a signal-layer structure constituted by the abovementioned silver-palladium layer.

It goes without saying that the aforementioned positive electrode may be formed of a material containing in addition to silver and palladium one or more base metals selected from a group consisting of tin, indium, gallium, indium-gallium alloys, nickel antimony and aluminum as in the case of the second electrically conductive layer of the negative pole electrode.

In the ceramic semiconductor device according to the instant embodiment, the first electrically conductive layer of the negative pole electrode and the aforementioned electrically conductive layer of the positive pole electrode in its preferred realizing mode are formed of an electrically conductive layer capable of being ohmic-contacted to the positive ceramic semiconductor substrate. A preferred example of such electrically conductive material is nickel. Beside nickel, the layer in concern may be formed of a material containing silver as a main component or one or more metals selected from a group consisting of aluminum, tin and bronze. The material containing silver as the main component may additionally include one or more metals selected from a group of tin, indium, gallium, indium-gallium alloys, nickel, antimony and aluminum.

In the positive ceramic semiconductor substrate according to the instant embodiment of the invention, the composition of the Ag-Pd layer for the positive and negative pole electrodes is selected such that the content of silver (Ag) lies within a range of 40 wt. % to 90 wt. % while that of palladium (Pd) is in a range of 60 wt. % to 10 wt. %. As the content of palladium increases, the migrationproof property is enhanced as shown in FIG. 4, from which it will be seen that no silver-migration phenomenon occurs when the content of palladium exceeds 10 wt. %. In contrast, when the content of palladium goes beyond 40 wt. %, the interfacial resistance makes appearance between the positive ceramic semiconductor substrate and the electrode, resulting in progressive decreasing of the rush current, while the surface resistance is concurrently increased to make the contact area be reduced to a point contact, incurring the current concentration. Further, increased content of palladium is expensive from the economical viewpoint. Accordingly, the content of palladium should preferably be smaller than 60 wt. % for practical applications, and more preferably in a range of 20 wt. % to 30 wt. % in consideration of the reliability in performance and the manufacturing cost.

The instant embodiment of the invention is susceptible to various modifications mentioned below in addition to the modifications described hereinbefore.

(8) Although a powder mixture of silver, palladium and base metal is used as the starting material, similar effect can be obtained when pulverized alloy of silver, palladium and base metal is employed as the starting material.

(9) The method of forming the electrode is not restricted to the non-electrolyte plating method (for forming nickel layer) and the paste/printing method (for forming Ag-Pd-base metal layer), but flame spraying method, sputtering, CVD (chemical vapor deposition), vacuum evaporation and the like methods may be adopted.

(10) The starting material containing silver, palladium and base metal as main components may be added with bismuth compounds or the like for enhancing the bonding strength, brazing feasibleness and the like properties.

(11) Combinations of two or more types of base metals may be used in place of employing only one type of base metal. Further, zinc or the like which can improve the ohmic contact may be added.

(12) Concerning the electrode structure exemplified by the one shown in FIG. 18, the nickel layer 2 may be formed over the whole surface of the substrate 1 and the electrically conductive layer 3 may be so formed over the nickel layer 2 that the peripheral surface of the substrate is covered by the layer 3. Further, a part of the nickel layer 2 may be left uncovered by the electrically conductive layer 3 in the course of the manufacturing process.

We claim:

1. A positive ceramic semiconductor device, comprising a pair of electrodes formed on a positive ceramic semiconductor substrate which is constituted by a material of a barium titanate series which exhibits a positive temperature coefficient of resistance and has a Curie point at which resistance of the material increases steeply at a predetermined temperature, wherein one of said paired electrodes which is to serve as the positive pole is formed of an electrically conductive alloy material containing silver and palladium in such a ratio that the content of silver ranges from 40 wt. % to 90 wt. % while that of palladium ranges from 60 wt. % to 10 wt. % in silver-palladium series.

2. A positive ceramic semiconductor device according to claim 1, wherein said ratio is such that the content of silver is in a range of 70 wt. % to 80 wt. % and that of palladium is in a range of 30 wt. % to 20 wt. %.

3. A positive ceramic semiconductor device, comprising a pair of electrodes formed on a positive ceramic semiconductor substrate which is constituted by a material of barium titanate series which exhibits a positive temperature coefficient of resistance and has a Curie point at which resistance of the material increases steeply at a predetermined temperature, wherein one of said paired electrodes which is to serve as the positive pole is formed of at least an electrically conductive layer composed of silver particles having respective surfaces deposited with solid solution layers of silver-palladium, the silver-palladium series containing silver and palladium in such a ratio that the content of silver ranges from 80 wt. % to 98 wt. % while that of palladium ranges from 20 wt. % to 2 wt. %.

4. A positive ceramic semiconductor device according to claim 3, wherein said ratio is such that the content of silver ranges form 85 wt. % to 95 wt. % while that of palladium ranges form 15 wt. % to 5 wt. %.

5. A positive ceramic semiconductor device, comprising a pair of electrodes formed on a positive ceramic semiconductor substrate which is constituted by a material of a barium titanate series which exhibits a positive temperature coefficient of resistance and has a Curies point at which resistance of the material increases steeply at a predetermined temperature, wherein one of said paired electrodes which is to serve as the positive pole is constituted by an electrically conductive metal layer ohmically-contacted to said substrate and an electrically conductive layer formed on said electrically conductive metal layer and containing an alloy of silver and palladium, said electrically conductive metal layer ohmically-contacted to said substrate containing a metal material having a high electric conductivity as compared with that of said electrically conductive layer containing the silver-palladium alloy, wherein a composition of the two constituent series of silver and palladium is so selected that the content of silver ranges from 40 wt. % to 90 wt. % while that of palladium ranges from 60 wt. % to 10 wt. % in silver-palladium series.

6. A positive ceramic semiconductor device according to claim 5, wherein said ohmic-contacted electrically conductive metal layer is realized in a two-layer structure constituted by a nickel layer formed directly on said substrate in ohmic contact therewith and an intermediate layer of an electrically conductive metal formed on said nickel layer, wherein said intermediate layer is formed of the electrically conductive metal material having a high electric conductivity as compared with that of said electrically conductive layer containing the silver-palladium alloy.

7. A positive ceramic semiconductor device according to claim 6, wherein said intermediate layer is composed of one material selected from a group consisting of silver, aluminum, tin and bronze.

8. A positive ceramic semiconductor device according to claim 7, wherein said intermediate layer is composed of silver material.

9. A positive ceramic semiconductor device according to claim 6, wherein said electrically conductive layer containing the alloy of silver and palladium is so formed as to cover an outer peripheral edge of said intermediate layer.

10. A positive ceramic semiconductor device according to claim 5, wherein said ohmic-contacted electrically conductive metal layer is realized in a single-layer structure constituted by a layer of a metal material having a high electric conductivity as compared with that of said electrically conductive layer containing said alloy of silver and palladium.

11. A positive ceramic semiconductor device according to claim 10, wherein said electrically conductive metal layer is formed of one material selected from a group consisting of aluminum, tin, bronze and silver.

12. A positive ceramic semiconductor device according to claim 8, wherein the other electrode of said paired electrodes which is to serve as the negative pole is realized in a two-layer structure composed of a nickel layer formed directly on said substrate in ohmic contact therewith and a silver layer formed on said nickel layer.

13. A positive ceramic semiconductor device according to claim 8, wherein the other electrode of said paired electrodes which is to serve as the negative pole is realized in a three-layer structure composed of a nickel layer formed directly on said substrate in ohmic contact therewith, a silver layer formed on said nickel layer and an electrically conductive layer formed on said silver layer and containing an alloy of silver and palladium at such a ratio that the content of silver ranges from 40 wt. % to 90 wt. % to 90 wt. % while that of palladium ranges from 60 wt. % to 10 wt. %.

14. A positive ceramic semiconductor device, comprising a pair of electrodes formed on a positive ceramic semiconductor substrate which is a constituted by a material of a barium titanate series which exhibits a positive temperature coefficient of resistance and has a Curie point at which resistance of the material increases steeply at a predetermined temperature, wherein one of said paired electrodes to serve as the positive pole is constituted by a single layer of an electrically conductive material containing an alloy of silver and palladium, the composition of the two-component series of silver and palladium being so selected that the content of silver ranges from 40 wt. % to 90 wt. % while that of palladium ranges from 60 wt. % to 10 wt. %, the other electrode of said paired electrodes which is to series as the negative pole being constituted by an electrically conductive metal layer ohmically-contacted to said substrate and an electrically conductive layer formed on said metal layer and containing an alloy of silver and palladium, said ohmically-contacted electrically conductive metal layer containing a metal material having a high electric conductivity when compared with that of said electrically conductive layer containing the alloy of silver and palladium, a composition of the two-component series of silver and palladium being so selected that the content of silver ranges from 40 wt. % to 90 wt. % while that of palladium is in a range of 60 wt. % to 10 wt %.

15. A positive ceramic semiconductor device according to claim 14, wherein said ohmic-contacted electrically conductive metal layer is realized in a two-layer structure constituted by a nickel layer formed directly on said substrate in ohmic contact therewith and an intermediate layer formed on said nickel layer, said intermediate layer being formed of a metal material having a high electrical conductivity when compared with that of said electrically conductive layer containing the alloy of silver and palladium.

16. A positive ceramic semiconductor device according to claim 14, wherein said intermediate layer is formed of one material selected from a group consisting of silver, aluminum, tin and bronze.

17. A positive ceramic semiconductor device according to claim 16, wherein said intermediate layer is formed of silver material.

18. A positive ceramic semiconductor device according to claim 17, wherein said electrically conductive layer containing the alloy of silver and palladium is so formed as to cover an outer peripheral edge of said silver layer.

19. A positive ceramic semiconductor device, comprising a pair of electrodes formed on a positive ceramic semiconductor substrate which is constituted by a material of abarium titanate series which exhibits a positive temperature coefficient of resistance and has a Curie point at which resistance of the material increases steeply at a predetermined temperature, wherein one of said paired electrodes which is to serve as the positive pole is formed of at least an electrically conductive material containing at least silver and palladium at such a ratio that the content of silver in the silver-palladium series ranges from 40 wt. % to 90 wt. % while that of palladium is in a range of 60 wt. % to 10 wt. %, the other of said paired electrodes which is to serve as the negative pole being realized in a two-layer structure constituted by a first electrically conductive layer formed on the surface of said substrate in ohmic contact therewith and a second electrically conductive lay formed on said first conductive layer and the surface of the ceramic semiconductor substrate so as to cover an outer peripheral edge of said first electrically conductive layer, said second electrically conductive layer being formed of an electrically conductive material which contains at least 40 wt. % to 90 wt. % of silver, 60 wt. % to 10 wt. % of palladium and at least one base metal selected from a group consisting of tin, indium, gallium, alloys of indium and gallium, nickel, antimony and aluminum.

20. A positive ceramic semiconductor device according to claim 19, wherein the contents of said base metals which can be contained in said electrically conductive layer are, respectively, as follows:

tin: 5 wt. % to 60 wt. %
indium: 2.5 wt. % to 50 wt.%
indium-gallium alloy: 2.5 wt. % to 50 wt. %
nickel: 10 wt. % to 60 wt. %
antimony: 2.5 wt. % to 60 wt. % alminum: 5 wt. % to 70 wt. %

21. A positive ceramic semiconductor device according to claim 20, wherein said indium-gallium alloy contains 25 wt. % of indium and 75 wt. % of gallium.

* * * * *